(12) United States Patent
Mourrier

(10) Patent No.: US 12,278,626 B2
(45) Date of Patent: Apr. 15, 2025

(54) DRIVER CIRCUIT FOR BYPASS POWER TRANSISTOR INCLUDING SECONDARY SUPPLY INPUT CONNECTION FROM A POWER DELIVERY CIRCUIT

(71) Applicant: Infineon Technologies AG, Neubiberg (DE)

(72) Inventor: Andre Mourrier, Manosque (FR)

(73) Assignee: Infineon Technologies AG, Neubiberg (DE)

( * ) Notice: Subject to any disclaimer, the term of this patent is extended or adjusted under 35 U.S.C. 154(b) by 70 days.

(21) Appl. No.: 18/448,255

(22) Filed: Aug. 11, 2023

(65) Prior Publication Data

US 2025/0055453 A1 Feb. 13, 2025

(51) Int. Cl.
*H02J 9/00* (2006.01)
*B60L 58/22* (2019.01)
*H02J 9/06* (2006.01)
*H03K 17/30* (2006.01)
*H03K 17/687* (2006.01)

(52) U.S. Cl.
CPC ............ *H03K 17/687* (2013.01); *B60L 58/22* (2019.02); *H03K 17/302* (2013.01); *B60L 2240/547* (2013.01)

(58) Field of Classification Search
None
See application file for complete search history.

(56) References Cited

U.S. PATENT DOCUMENTS

| | | | | |
|---|---|---|---|---|
| 6,295,215 B1* | 9/2001 | Faria | ...................... | H02J 9/062 363/124 |
| 6,917,124 B2* | 7/2005 | Shetler, Jr. | .............. | H02J 9/061 307/66 |
| 8,693,197 B2* | 4/2014 | Tong | ...................... | H02M 5/458 361/720 |
| 8,823,292 B2* | 9/2014 | Sumi | ....................... | F04B 35/04 318/35 |
| 9,019,731 B2* | 4/2015 | Tong | .................. | H05K 7/20936 363/37 |

(Continued)

OTHER PUBLICATIONS

U.S. Appl. No. 18/448,271, filed Aug. 11, 2023, naming inventor Mourrier.

(Continued)

*Primary Examiner* — Kenneth B Wells
(74) *Attorney, Agent, or Firm* — Shumaker & Sieffert, P.A.

(57) ABSTRACT

A driver circuit is configured control one or more bypass transistors. The driver circuit includes a primary supply input connection configured to supply the driver circuit with power from a set of battery cells. The set of battery cells is configured to supply power to a load via a power delivery circuit. The driver circuit also includes one or more secondary supply input connections. The driver circuit is configured to receive information indicating whether an error condition is present in the power delivery circuit and control, based on the error condition being present in the power delivery circuit, the one or more bypass transistors to define a bypass current path. The driver circuit is also configured to receive, via a secondary supply input connection of the one or more secondary supply input connections, power from the bypass current path.

21 Claims, 8 Drawing Sheets

(56) References Cited

U.S. PATENT DOCUMENTS

| | | | | |
|---|---|---|---|---|
| 9,025,350 B2 * | 5/2015 | Gan | ...................... | H02M 7/49 |
| | | | | 363/56.05 |
| 10,756,567 B2 * | 8/2020 | Masunaga | ............... | H02J 9/062 |
| 10,763,694 B2 * | 9/2020 | Kobayashi | .............. | H02J 9/062 |

OTHER PUBLICATIONS

"TLE9012DQU: Li-ion battery monitoring and balancing IC", Infineon Technologies AG, Retrieved from: https://www.infineon.com/cms/en/product/battery-management-ics/tle9012dqu/, Jan. 24, 2022, 76 pp.

\* cited by examiner

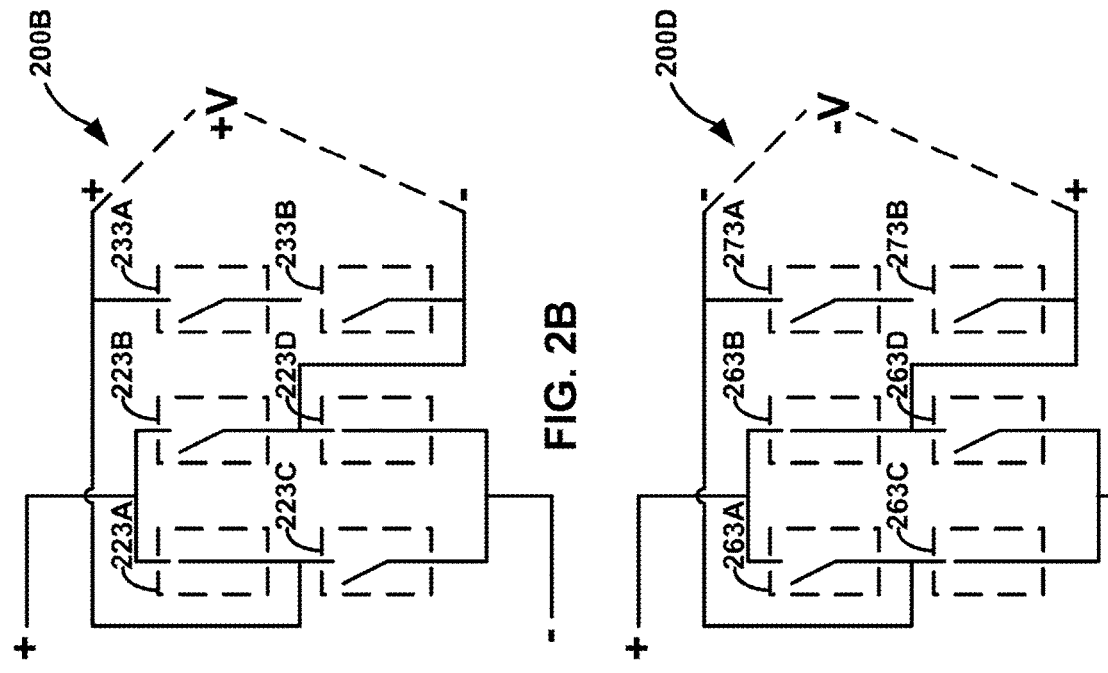
FIG. 2B
FIG. 2D
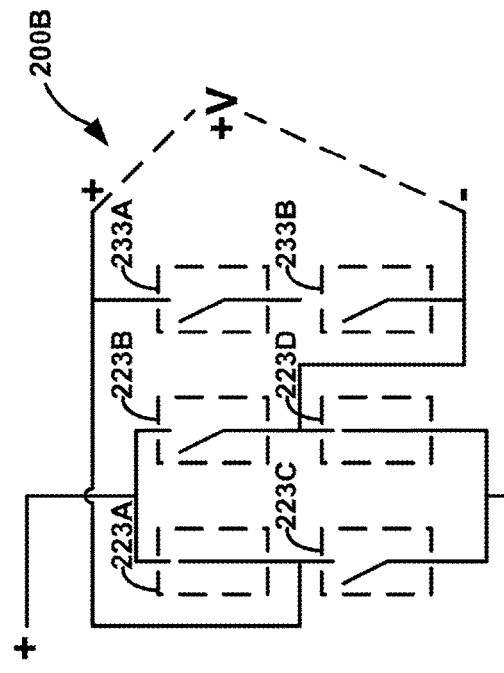
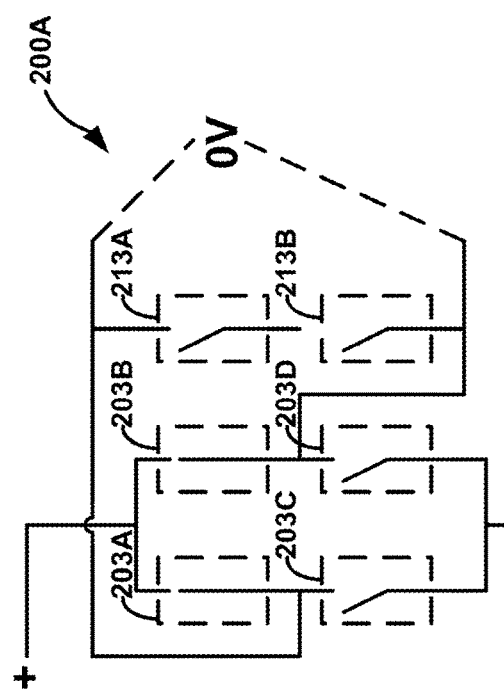
FIG. 2A
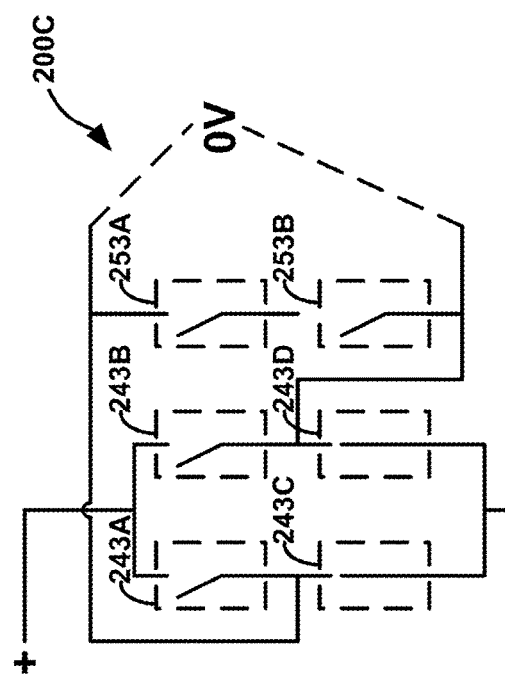
FIG. 2C

DRIVER CIRCUIT FOR BYPASS POWER TRANSISTOR INCLUDING SECONDARY SUPPLY INPUT CONNECTION FROM A POWER DELIVERY CIRCUIT

TECHNICAL FIELD

This disclosure relates to circuits for controlling current across semiconductor devices.

BACKGROUND

Driver circuits are often used to control a voltage, current, or power at a load. For instance, a set of semiconductor devices may be part of one or more circuits that provide an electrical signal to a load, such as an electric motor. The set of semiconductor devices may be part of power converters, power supply devices, bypass circuits, or other kinds of circuits. Gate driver circuits, in some cases, may control the set of semiconductor devices by delivering electrical signals to respective gate terminals of the set of semiconductor devices.

SUMMARY

In general, this disclosure is directed to devices, systems, and techniques for supplying power to a gate driver sufficient to control one or more bypass transistors when an error condition is present in a circuit for supplying power to a load. For example, a system may include a set of circuits each comprising a set of battery cells configured to supply power to a load via a power delivery circuit. When an error condition is present in a circuit, a bypass gate driver may control one or more bypass transistors to prevent the power delivery circuit or other components of the circuit from being damaged. In some examples, the bypass gate driver may turn on the one or more bypass transistors to create a bypass current path. The bypass current path may prevent a power surge caused by an error condition from causing damage to components of the circuit for delivering power to the load via the power delivery circuit.

A bypass gate driver may include one or more power supply connections and circuit supply paths that are configured to supply power to the bypass gate driver for controlling one or more bypass transistors. In some examples, the bypass gate driver may receive power from a primary supply connection or circuit supply path when the circuit for supplying power to the load is operating normally without error conditions. In response to an error condition being present in the circuit for supplying power to the load, the bypass gate driver may control the one or more bypass transistors to define a bypass current path. To control the one or more bypass transistors to define the bypass current path, the bypass gate driver may deliver power that is greater than a gate power threshold to the one or more bypass transistors. A system may ensure that the bypass gate driver receives sufficient power for controlling the one or more bypass transistors when an error condition is present. For example, the system may cause the bypass gate driver to receive power from a secondary supply connection or circuit supply path when the error condition is present, thus causing the bypass gate driver to receive sufficient power for controlling the one or more bypass transistors even when the primary supply connection or circuit supply path does not deliver sufficient power to the bypass gate driver.

In some examples, a primary supply connection or circuit supply path for the bypass gate driver may deliver power to the bypass gate driver from the set of battery cells. For example, a supply connection of the bypass gate driver may be connected to a node that receives power form the set of battery cells. When an error condition is not present in the set of battery cells or in the power delivery circuit, the bypass gate driver may receive power from the set of battery cells via the primary supply connection or circuit supply path. But when an error condition is present in the set of battery cells or in the power delivery circuit, the power delivered to the bypass gate driver may be insufficient for controlling the one or more bypass transistors to define the bypass current path. This means that it may be beneficial for the system to deliver power to the bypass gate driver via a secondary supply connection or circuit supply path when an error condition is present in the set of battery cells or in the power delivery circuit.

The techniques of this disclosure may provide one or more advantages. For example, when an error condition is present in the power delivery circuit and when the bypass gate driver controls the one or more bypass transistors to define the bypass current path, the bypass gate driver may receive power via one or more secondary supply connections that are connected to the bypass current path. That is, the bypass gate driver may receive power from the bypass current path that the bypass gate driver creates when an error condition is present. In some examples, when an error condition is present in the set of battery cells, the bypass gate driver may receive power from a secondary driver circuit supply path that delivers power from the set of battery cells without reaching the error condition present in the set of battery cells. In any case, supplying a gate driver circuit via a secondary supply connection or secondary driver circuit supply path when an error condition is present may better ensure that the gate driver circuit receives sufficient power when the error condition is present as compared with systems that do not include secondary power sources for bypass gate drivers.

In some examples, a driver circuit is configured control one or more bypass transistors. The driver circuit includes a primary supply input connection configured to supply the driver circuit with power from a set of battery cells, wherein the set of battery cells is configured to supply power to a load via a power delivery circuit. The driver circuit also includes one or more secondary supply input connections. The driver circuit is configured to receive information indicating whether an error condition is present in the power delivery circuit and control, based on the error condition being present in the power delivery circuit, the one or more bypass transistors to define a bypass current path between the one or more bypass transistors and the load. The driver circuit is also configured to receive, via a secondary supply input connection of the one or more secondary supply input connections, power from the bypass current path, wherein the power from the bypass current path exceeds a power threshold for controlling the one or more bypass transistors to define the bypass current path.

In some examples, a method for controlling one or more bypass transistors includes supplying, by a primary supply input connection of a driver circuit, the driver circuit with power from a set of battery cells, wherein the set of battery cells is configured to supply power to a load via a power delivery circuit and receiving, by the driver circuit, information indicating whether an error condition is present in the power delivery circuit and controlling, by the driver circuit based on the error condition being present in the power delivery circuit, the one or more bypass transistors to define a bypass current path for bypassing the power delivery circuit. The method also includes receiving, by the driver circuit via a secondary supply input connection of the one or more secondary supply input connections, power from the bypass current path, wherein the power from the bypass current path exceeds a power threshold for controlling the one or more bypass transistors to define the bypass current path.

In some examples, a system includes a set of battery cells and a power delivery circuit that includes four power transistors arranged in an H-bridge. The power delivery circuit is configured to deliver power from the set of battery cells to a load. The system also includes an H-bridge driver circuit configured to control the four power transistors arranged in the H-bridge, one or more bypass transistors, and a bypass driver circuit configured control the one or more bypass transistors. The bypass driver circuit includes a primary supply input connection configured to supply the bypass driver circuit with power from the set of battery cells and one or more secondary supply input connections. The bypass driver circuit is configured to receive information indicating whether an error condition is present in the power delivery circuit, control, based on the error condition being present in the power delivery circuit, the one or more bypass transistors to define the bypass current path for bypassing power delivery circuit, and receive, via a secondary supply input connection of the one or more secondary supply input connections, power from the bypass current path, wherein the power from the bypass current path exceeds a power threshold for controlling the one or more bypass transistors to define the bypass current path.

In some examples, a driver circuit is configured control one or more bypass transistors. The driver circuit includes one or more supply connections configured to supply power from a set of battery cells. The set of battery cells is configured to supply power to a load via a power delivery circuit. The driver circuit is configured to receive information indicating whether an error condition is present in the set of battery cells that prevents the driver circuit from receiving power via the one or more supply connections from a primary driver circuit supply path across the set of battery cells, activate, based on the error condition being present in the set of battery cells, the one or more bypass transistors to define a bypass current path to bypass the power delivery circuit, and receive, via the one or more supply connections, power from a secondary driver circuit supply path across one or more battery cells of the set of battery cells, wherein current flows through the secondary driver circuit supply path without reaching the error condition.

In some examples, a method includes receiving, by a driver circuit comprising one or more supply connections configured to supply power from a set of battery cells, information indicating whether an error condition is present in a set of battery cells that prevents the driver circuit from receiving power from a primary driver circuit supply path across the set of battery cells, wherein the set of battery cells is configured to supply power to a load via a power delivery circuit, activating, by the driver circuit based on the error condition being present in the set of battery cells, the one or more bypass transistors to define a bypass current path to bypass the power delivery circuit, and receiving, by the driver circuit via the one or more supply connections, power from a secondary driver circuit supply path across one or more battery cells of the set of battery cells, wherein current flows through the secondary driver circuit supply path without reaching the error condition.

In some examples, a system includes a set of battery cells and a power delivery circuit that includes four power transistors arranged in an H-bridge. The power delivery circuit is configured to deliver power from the set of battery cells to a load. The system also includes an H-bridge driver circuit configured to control the four power transistors arranged in the H-bridge, one or more bypass transistors, and a bypass driver circuit configured control the one or more bypass transistors, the bypass driver circuit comprising one or more supply connections configured to supply power from the set of battery cells. The bypass driver circuit is configured to receive information indicating whether an error condition is present in the set of battery cells that prevents the bypass driver circuit from receiving power via the one or more supply connections from a primary driver circuit supply path across the set of battery cells, activate, based on the error condition being present in the set of battery cells, the one or more bypass transistors to define a bypass current path to bypass the power delivery circuit, and receive, via the one or more supply connections, power from a secondary driver circuit supply path across one or more battery cells of the set of battery cells, wherein current flows through the secondary driver circuit supply path without reaching the error condition.

The summary is intended to provide an overview of the subject matter described in this disclosure. It is not intended to provide an exclusive or exhaustive explanation of the systems, devices, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF THE DRAWINGS

FIGS. 2A-2D are circuit diagrams illustrating example configurations of a power delivery circuit, in accordance with one or more techniques of this disclosure.

DETAILED DESCRIPTION

Figure 1:
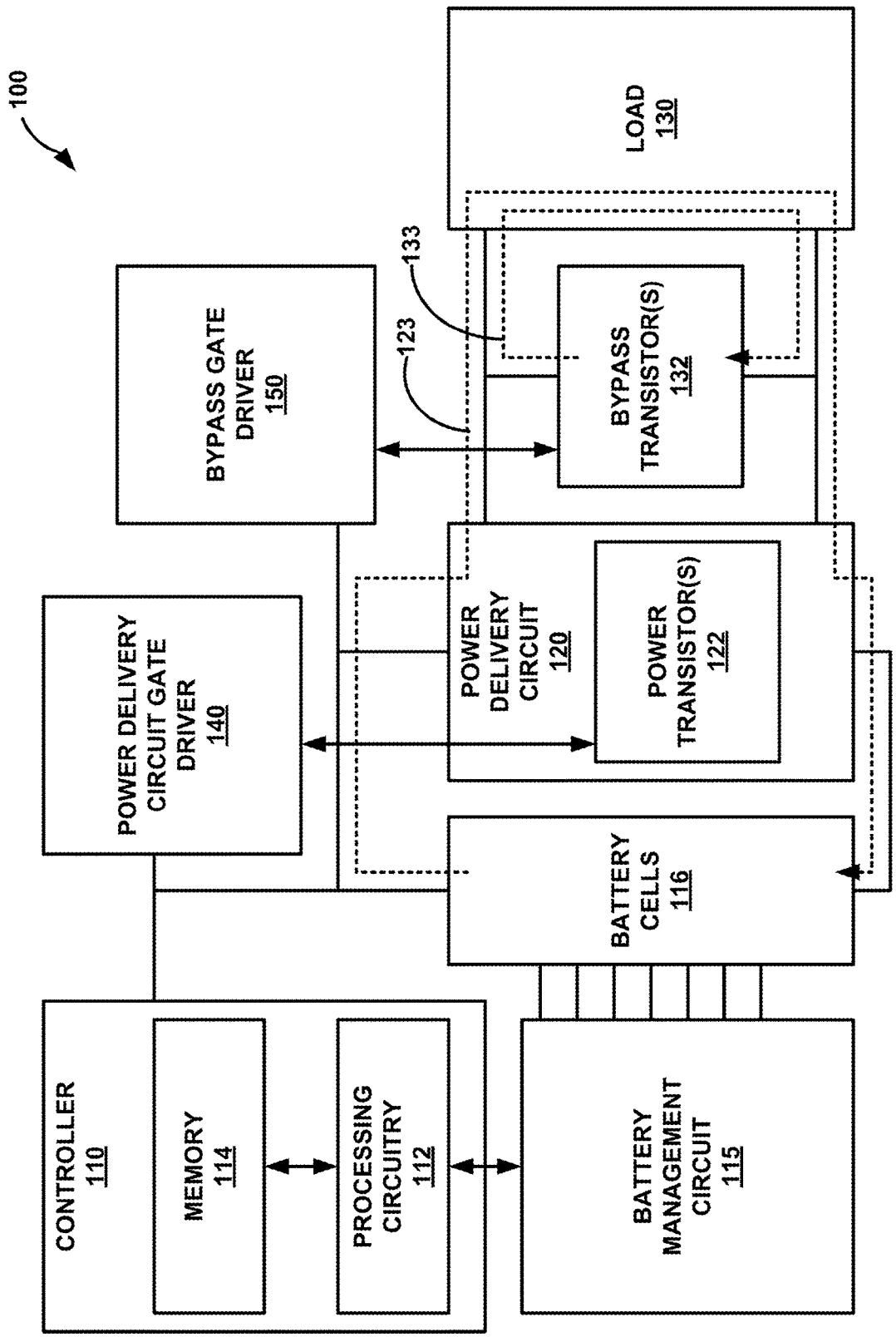
FIG. 1 is a block diagram illustrating a system for controlling a bypass current path of a circuit for delivering power to a load, in accordance with one or more techniques of this disclosure.

FIG. 1 is a block diagram illustrating a system 100 for controlling a bypass current path of a circuit for delivering power to a load, in accordance with one or more techniques of this disclosure. As seen in FIG. 1, system 100 includes controller 110, battery cells 116, power delivery circuit 120, bypass transistor(s) 132, load 130, power delivery circuit gate driver 140, and bypass gate driver 150. Controller 110 includes processing circuitry 112, memory 114, and battery management circuit 115. Power delivery circuit 120 includes power transistor(s) 122. Controller 110 may be configured to control battery cells 116 to deliver power to load 130 via power delivery circuit 120.

Controller 110 may include processing circuitry 112. Processing circuitry 112 may include, for example, one or more microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, processing circuitry 112 may include any suitable structure, whether in hardware, software, firmware, or any combination thereof, to perform the functions ascribed herein to controller 110.

Controller 110 may include a memory 114 in communication with the processing circuitry 112. In some examples, the memory 114 in communication with processing circuitry 112 includes computer-readable instructions that, when executed by the processing circuitry 112, cause system 100 to perform various functions attributed to first system 100 herein. The memory 114 may include any volatile, non-volatile, magnetic, optical, or electrical media, such as a random-access memory (RAM), read-only memory (ROM), non-volatile RAM (NVRAM), electrically erasable programmable ROM (EEPROM), flash memory, or any other digital media capable of storing information.

Processing circuitry 112 may be in communication with battery management circuit 115. Battery management circuit 115 may be configured to control and/or monitor the set of battery cells 116. For example, battery management circuit 115 may output one or more instructions to the set of battery cells 116. Additionally, or alternatively, battery management circuit 115 may receive information from battery cells 116. In some examples, battery management circuit 115 may control battery cells 116 based on information received from battery cells 116. In some examples, battery management circuit 115 may control battery cells 116 based on instructions received from processing circuitry 112.

In some examples, battery management circuit 115 is part of a battery management system (BMS) that includes battery management circuit 115, processing circuitry 112 of controller 110, and battery cells 116. A BMS may comprise a plurality of battery management circuits that each manage a subset of battery cells of battery cells 116. For example, battery management circuit 115 may comprise a plurality of cell management circuits that each manage a subset of battery cells of battery cells 116. For example, a first cell management circuit of the plurality of cell management circuits may manage a first subset of battery cells 116, a second cell management circuit of the plurality of cell management circuits may manage a second subset of battery cells 116, and so on. That is, battery cells 116 may comprise a plurality of subsets of battery cells that are each managed by a cell management circuit of battery management circuit 115. A BMS may include processing circuitry that balances subsets of cells of battery cells 116 relative to one another. For example, processing circuitry 112 may serve as the processing circuitry of a BMS including battery management circuit 115.

Battery cells 116 may include a set of battery cells connected in series, a set of battery cells connected in parallel, or a set of battery cells connected to each other via both parallel connections and series connections. In some examples, each battery cell of the battery cells 116 may include a lithium-ion cells. In other examples, battery cells 116 may include lead-acid cells, nickel metal hydride cells, or other materials. In some examples, an output of battery cells 116 is 24 Volts (V), but this is not required. The output of battery cells 116 may comprise any amount of voltage or current. In some examples, each battery cell of battery cells 116 may include a positive terminal and a negative terminal. In some examples, the battery cells 116 may as a unit include a positive terminal and a negative terminal. For example, the positive terminal of battery cells 116 may include a positive terminal of a first battery cell of battery cells 116 and the negative terminal of battery cells 116 may include a negative terminal of a last battery cell of battery cells 116. In some examples, battery cells 116 may comprise 12 battery cells, 16 battery cells, or any number. Battery management circuit 115 may be designed or configured to manage 12 or fewer cells or possibly 16 or fewer cells.

Power delivery circuit 120 may include power transistor(s) 122. In some examples, the power delivery circuit 120 may be configured to deliver power to load 130 from battery cells 116 according to one or more operational modes. For example, power delivery circuit 120 may deliver a positive voltage to load 130 according to a first one or more operational modes, power delivery circuit 120 may deliver a negative voltage to load 130 according to a second one or more operational modes, and power delivery circuit 120 may deliver zero voltage to load 130 according to a third one or more operational modes. In some examples, current may flow from battery cells 116 to load 130 according to current path 123. For example, current may flow clockwise from a first end of battery cells 116 to power delivery circuit 120, flow from power delivery circuit 120 to load 1430, flow from load 130 back to power delivery circuit 120, and flow from power delivery circuit 120 to a second end of battery cells 116. System 100 is not limited to current flowing clockwise according to current path 123. In some examples, current may flow counterclockwise according to current path 123.

Power transistor(s) 122 may represent semiconductor devices or other kinds of switches. Each power transistor of power transistor(s) 122 may, in some cases, include a power switch such as, but not limited to, any type of field-effect transistor (FET) including any one or combination of a metal-oxide-semiconductor field-effect transistor (MOSFET), a bipolar junction transistor (BJT), an insulated-gate bipolar transistor (IGBT), a junction field effect transistor (JFET), a high electron mobility transistor (HEMT), or other kinds of elements that use voltage or current for control. Additionally, each power transistor of power transistor(s) 122 may include any one or combination of n-type transistors, p-type transistors, and other kinds of power transistors. In some examples, each power transistor of power transistor(s) 122 includes vertical transistors, lateral transistors, and/or horizontal transistors. In some examples, each power transistor of power transistor(s) 122 includes other analog devices such as diodes and/or thyristors. In some examples, each power transistor of power transistor(s) 122 may operate as a switch and/or operate as an analog device.

In some examples, each power transistor of power transistor(s) 122 includes three terminals: two load terminals and a control terminal. When a power transistor represents a MOSFET, the power transistor may include a drain terminal, a source terminal, and at least one gate terminal, where the control terminal is a gate terminal. When a power transistor represents a BJT switch, the control terminal may represent a base terminal. Current may flow between the two load terminals of a power transistor, based on the voltage at the respective control terminal. Therefore, electrical current may flow across the power transistor based on control signals delivered to the control terminal of the power transistor. In one example, if a voltage applied to the control terminal of the power transistor is greater than or equal to a voltage threshold, the power transistor may be activated, allowing the power transistor to conduct electricity. Furthermore, the power transistor may be deactivated when the voltage applied to the control terminal of the power transistor is below the threshold voltage, thus preventing the power transistor from conducting electricity. Controller 110 may be configured to control each of power transistor(s) 122.

Each power transistor of power transistor(s) 122 may include various material compounds, such as Silicon, Silicon Carbide, Gallium Nitride, or any other combination of one or more semiconductor materials. In some examples, silicon carbide switches may experience lower switching power losses. Improvements in magnetics and faster switching, such as Gallium Nitride switches, may allow a power transistor to draw short bursts of current. These higher frequency devices may require control signals (e.g., voltage signals delivered to the control terminal of the power transistor) to be sent with more precise timing, as compared to lower-frequency devices.

In some examples, power transistor(s) 122 may be arranged so that power delivery circuit 120 forms an H-bridge circuit. The H-bridge circuit may, in some cases, be configured as a stepwise inverter circuit. In this example, power transistor(s) 122 may include a first power transistor, a second power transistor, a third power transistor, and a fourth power transistor. In some examples, the first power transistor and the second power transistor may represent high-side power transistors that are connected to a positive terminal of battery cells 116. In some examples, the third power transistor and the fourth power transistor may represent low-side power transistors that are connected to a negative terminal of battery cells 116. Power transistor(s) 122 of the H-bridge circuit may be arranged so that the H-bridge circuit is configured to deliver a positive output, a negative output, or a zero output. This may allow controller 110 to control whether load 130 receives a positive output, a negative output, or a zero output from battery cells 116.

When both of the first power transistor and the second power transistor of the H-bridge are turned on and both of the third power transistor and the fourth power transistor are turned off, power delivery circuit 120 may output zero voltage to load 130. When both of the first power transistor and the second power transistor of the H-bridge are turned off and both of the third power transistor and the fourth power transistor are turned on, power delivery circuit 120 may output zero voltage to load 130. When the first power transistor and the fourth power transistor are turned on and the second power transistor and the third power transistor are turned off, power delivery circuit 120 may output a positive voltage to load 130. When the first power transistor and the fourth power transistor are turned off and the second power transistor and the third power transistor are turned on, power delivery circuit 120 may output a negative voltage to load 130.

In some examples, bypass transistor(s) 132 may represent semiconductor devices or other kinds of power switches. Bypass transistor(s) 132 may be substantially similar to power transistor(s) 122 in terms of structure and size, but this is not required. In some examples, bypass transistor(s) 132 may comprise different materials than power transistor(s) 122, different sizes or ratings, and/or may comprise different types of power switches than power transistor(s) 122. In any case, each bypass transistor of bypass transistor(s) 132 may be turned off or turned on. When bypass transistor(s) 132, current may flow across bypass transistor(s) 132. When one or more of bypass transistor(s) 132 are turned off, current might not flow across bypass transistor(s) 132.

When bypass transistor(s) 132 are turned on, current may flow according to a bypass current path 133 between bypass transistor(s) 132 and load 130. As seen in FIG. 1, bypass current path 133 may flow clockwise from a first end bypass transistor(s) 132 to load 130, and from load 130 to a second end of bypass transistor(s) 132. Bypass current path 133 is not limited to flowing clockwise. Bypass current path 133 may, in some examples, flow counterclockwise from the second end of bypass transistor(s) 132 to load 130, and from load 130 to the first end of bypass transistor(s) 132. In some examples, when bypass transistor(s) 132 are turned on, current might not flow between battery cells 116 and load 130 according to current path 123. That is, bypass current path 133 may prevent current associated with load 130 from flowing to power delivery circuit 120 and damaging components of power delivery circuit 120 (e.g., power transistor(s) 122).

In some examples, when bypass transistor(s) 132 are turned off, current might not flow according to the bypass current path 133. In some examples, when bypass transistor(s) 132 are turned off, current may flow from battery cells 116 to load 130 according to bypass current path 133. In some examples, when no error conditions are present in battery cells 116 and/or power delivery circuit 120, bypass transistor(s) 132 may be turned off and current may flow according to current path 123 without flowing according to bypass current path 133. In some examples, when one or more error conditions are present in battery cells 116 and/or power delivery circuit 120, bypass transistor(s) 132 may be turned on and current may flow according to bypass current path 133 without flowing according to current path 123.

Controller 110 may be configured to output one or more commands to power delivery circuit gate driver 140 to control power transistor(s) 122 of power delivery circuit 120. For example, controller 110 may output commands for power delivery circuit gate driver 140 to control whether each power transistor of power transistor(s) 122 is turned on or turned off. This means that controller 110 is configured to control an operating mode of power delivery circuit 120. In examples where power delivery circuit 120 comprises an H-bridge, controller 110 may output one or more commands to power delivery circuit gate driver 140 to control power transistor(s) 122 so that power delivery circuit 120 outputs a positive voltage, a negative voltage, or zero voltage.

Controller 110 may be configured to output one or more commands to bypass gate driver 150 to control bypass transistor(s) 132. For example, controller 110 may output commands for bypass gate driver 150 to control whether each bypass transistor of bypass transistor(s) 132 is turned on or turned off. When one or more error conditions are present in battery cells 116 and/or power delivery circuit 120, controller 110 may output one or more commands for bypass gate driver 150 to turn on bypass transistor(s) 132. When no error conditions are present in battery cells 116 and/or power delivery circuit 120, controller 110 may output one or more commands for bypass gate driver 150 to control bypass transistor(s) 132 to remain turned off.

Commands output from controller 110 to power delivery circuit gate driver 140 and commands output from controller 110 to bypass gate driver 150 may, in some examples, comprise on-off commands for controlling individual transistors. For example, a command may include a pulse-width modulation (PWM) signal including a duty cycle and a switching frequency. The duty cycle may represent a percentage of each switching cycle that a transistor is turned on, and a switching frequency may represent a frequency at which a transistor completes switching cycles. Power delivery circuit gate driver 140 and/or bypass gate driver 150 may generate PWM drive signals for output to gate terminals of transistors based on receiving PWM signals for controlling the transistors.

In some examples, bypass gate driver 150 includes a primary supply input connection configured to supply the bypass gate driver 150 with power from battery cells 116. In some examples, the primary supply input connection may be connected to a node that is connected to a first side of battery cells 116. In some examples, bypass gate driver 150 includes one or more secondary supply input connections. These one or more secondary supply input connections may be connected to one or more locations along bypass current path 133. This means that when bypass transistor(s) 132 are activated and current flows along bypass current path 133, bypass gate driver 150 may receive power from the bypass current path 133 via the one or more secondary supply input connections.

During normal operation of system 100 when no error conditions are present in battery cells 116 and/or power delivery circuit 120, bypass gate driver 150 may receive sufficient power via the primary supply input for controlling bypass transistor(s) 132. But when one or more error conditions are present in power delivery circuit 120, the amount of power received by bypass gate driver 150 via the primary supply input might not be sufficient for controlling bypass transistor(s) 132 to form the bypass current path 133. When one or more error conditions are present in power delivery circuit 120, the amount of power received by bypass gate driver 150 via the one or more secondary supply input connections may be sufficient for bypass gate driver 150 to control bypass transistor(s) 132 to form the bypass current path 133.

In some examples, bypass gate driver 150 may receive information indicating whether an error condition is present in power delivery circuit 120. The information indicating whether an error condition is present in power delivery circuit 120 may, in some examples, comprise a command from controller 110 to turn on bypass transistor(s) 132. That is, controller 110 may identify the error condition present in power delivery circuit 120 and output a command to bypass gate driver 150 to turn on bypass transistor(s) 132. In some examples, bypass gate driver 150 may determine whether an error condition is present in power delivery circuit 120 based on information received from power delivery circuit 120.

Error conditions present in power delivery circuit 120 may cause current avalanches. For example, an error condition present in one or more of power transistor(s) 122 may result in a current avalanche. In some examples, a current avalanche caused by an error condition present in one or more of power transistor(s) 122 may be associated with load 130. A current avalanche may damage one or more components of power delivery circuit 120 if the current avalanche reaches power delivery circuit 120. When bypass transistor(s) 132 are turned on, a current avalanche caused by an error condition present in one or more of power transistor(s) 122 may be confined to bypass current path 133. That is, current associated with the current avalanche may flow through bypass current path 133 without reaching power delivery circuit 120.

Based on the error condition being present in power delivery circuit 120, bypass gate driver 150 may control the bypass transistor(s) 132 to define bypass current path 133 between bypass transistor(s) 132 and load 130. Bypass gate driver 150 may, in some examples, control bypass transistor(s) 132 to turn on to define the bypass current path 133. Bypass gate driver 150 may, receive, via a secondary supply input connection of the one or more secondary supply input connections, power from the bypass current path 133. The power received from the bypass current path 133 may exceed a power threshold for controlling the bypass transistor(s) 132 to define the bypass current path 133. In some examples, bypass gate driver 150 also receives power from battery cells 116 via the primary supply input when the error condition is present in power delivery circuit 160, but the power received via the primary supply input might not exceed the power threshold for controlling bypass transistor(s) 132 to define the bypass current path 133.

In some examples, based on the error condition not being present in the power delivery circuit 120, controller 110 may be configured to output one or more commands to bypass gate driver 150 to control bypass transistor(s) 132 not to define bypass current path 133. Bypass gate driver 150 is configured to receive power from the set of battery cells 116 via the primary supply input that exceeds a power threshold for controlling bypass transistor(s) 132 not to define bypass current path 133. In some examples, the power threshold for bypass gate driver 150 to control bypass transistor(s) 132 to define the bypass current path 133 is different from the power threshold for bypass gate driver 150 to control bypass transistor(s) 132 to not define the bypass current path 133. For example, a power threshold for bypass gate driver 150 to turn on bypass transistor(s) 132 may be greater than a power threshold for bypass gate driver 150 keep bypass transistor(s) 132 turned off.

Bypass gate driver 150 may, in some examples, include one or more supply connections that supply power from battery cells 116. In some examples, battery cells 116 supply power to bypass gate driver 150 via a primary driver circuit supply path through the one or more supply connections. In some examples, battery cells 116 supply power to bypass gate driver 150 via one or more secondary driver circuit supply paths through the one or more supply connections. In some examples, the one or more secondary driver circuit supply paths may be configured to supply power to bypass gate driver 150 even when there is an error condition present in battery cells 116 that prevent current from flowing across battery cells 116 from a first side of battery cells 116 to a second side of battery cells 116.

Bypass gate driver 150 may receive information indicating whether an error condition is present in battery cells 116 that prevents bypass gate driver 150 from receiving power via the one or more supply connections from the primary driver circuit supply path. In some examples, the primary driver circuit supply path involves current flowing across battery cells 116 from a first side of battery cells 116 to a second side of battery cells 116. In some examples, each secondary driver circuit supply path involves current flowing across a portion of battery cells 116 without flowing across all of battery cells 116 from the first side of battery cells 116 to the second side of battery cells 116. In some examples, the information indicating whether an error condition is present in battery cells 116 comprises a message and/or a command from controller 110. In some examples, bypass gate driver 150 identifies the error condition based on information received from battery cells 116.

Bypass gate driver 150 may activate, based on the error condition being present in battery cells 116, bypass transistor(s) 132 to define bypass current path 133. When an error condition is present in battery cells 116, this may cause a current surge associated with load 130. It may be beneficial for bypass gate driver 150 to activate bypass transistor(s) 132 based on the error condition being present in battery cells 116 in order to prevent this current surge from damaging components of power delivery circuit 120. For example, current associated with load 130 may flow according to bypass current path 133 without reaching power delivery circuit 120. As explained in more detail below, however, the ability to activate bypass transistor(s) 132 can sometimes be compromised by the error condition itself.

When bypass gate driver 150 activates bypass transistor(s) 132 to define bypass current path 133, bypass gate driver 150 is configured to receive power from a secondary driver circuit supply path via a secondary driver circuit supply path through the one or more supply connections. In some examples, current may flow through the secondary driver circuit supply path across one or more battery cells of battery cells 116 without reaching the error condition present in battery cells 116. In some examples, the power received by bypass gate driver 150 via the secondary driver circuit supply path exceeds a power threshold for controlling bypass transistor(s) 132 to define the bypass current path 133.

In some examples, when an error condition is not present in battery cells 116, bypass gate driver 150 may control bypass transistor(s) 132 not to form the bypass current path 133. For example, bypass gate driver 150 may control bypass transistor(s) 132 to remain turned off, allowing current to flow from battery cells 116 to load 130 according to current path 123. When no error conditions are present in battery cells 116, bypass gate driver 150 may receive power via the primary driver circuit supply path. In some examples, the power received via the primary driver circuit supply path is satisfies a power threshold for controlling bypass transistor(s) 132 not to form bypass current path 133.

Load 130, in some cases, may comprise a power unit for an electric motor such as a brushless direct current (BLDC) electric motor, a brushed direct current (DC) motor, an alternating current (AC) induction motor, or another type of electric motor. In the case where load 130 represents a power unit for a BLDC motor, the BLDC motor may operate according to any one of a set of phases, where each phase of the set of phases is associated with a respective input to load 130. For example, when power delivery circuit 120 may be configured to operate according to one or more operational modes that cause power delivery circuit 120 to deliver a positive voltage, operate according to one or more operational modes that cause power delivery circuit 120 to deliver a negative voltage, and operate according to one or more operational modes that cause power delivery circuit 120 to deliver zero voltage. Based on the operating mode of power delivery circuit 120, the power unit for the electric motor may operate in one or more respective phases of the set of phases. In some examples, the electric motor corresponding to load 130 may comprise an electric motor of a vehicle. Example vehicles include cars, trucks, buses, motorcycles, golf carts, all-terrain vehicles (ATVs), snowmobiles, aircraft, and watercraft.

An electric motor for load 130 is merely one example. More generally, however, load 130 is not limited to electric motors. Load 130 may define a collection of electrical components that consume power. In some examples, load 130 includes a collection of circuit components such as resistors, inductors, capacitors, diodes, and other semiconductor elements. Load 130 may include one or more post regulator circuits which increase or decrease the output voltage delivered by power delivery circuit 120. In some examples, load 130 electric components (e.g., dashboard, control panels, heating/cooling systems, and lights) of a vehicle. In other examples, load 130 includes electric motors and/or electric components used in applications other than vehicles.

In some examples, load 130 comprises one power unit of a set of power units for supplying power to a common load, such as an electric motor. For example, the set of power units may be connected in series so that an output voltage from the set of power units may comprise a summation of the voltages of the set of power units. Since power delivery circuit 120 may be configured to deliver a positive voltage, a negative voltage, or zero voltage to load 130, the voltage output from power delivery circuit 120 may affect the voltage output from the set of power units including the power unit corresponding to load 130. For example, the voltage output from the set of power units may be higher when power delivery circuit 120 outputs positive voltage to load 130 as compared to when power delivery circuit 120 operates zero voltage to load 130.

FIGS. 2A-2D are circuit diagrams illustrating example configurations 200A-200D of a power delivery circuit, in accordance with one or more techniques of this disclosure. In some examples, each of configurations 200A-200D correspond to an operational mode of a set of operational modes for power delivery circuit 120 of FIG. 1. For example, configuration 200A of FIG. 2A may represent a first operational mode of power delivery circuit 120, configuration 200B of FIG. 2B may represent a second operational mode of power delivery circuit 120, configuration 200C of FIG. 2C may represent a third operational mode of power delivery circuit 120, and configuration 200D of FIG. 2D may represent a fourth operational mode of power delivery circuit 120.

As seen in FIG. 2A, configuration 200A includes power transistor(s) 203A-203D (collectively, "power transistors 203") and bypass transistor(s) 213A, 213B (collectively, "bypass transistors 213"). Power transistors 203 may be examples of power transistor(s) 222 of FIG. 1. Bypass transistors 213 may be examples of bypass transistors 132 of FIG. 1. In configuration 200A, power transistors 203A, 203B are turned on and power transistors 203C, 203D are turned off. Since both of power transistors 203C, 203D are turned off, configuration 200A does not include any connection between a positive terminal of battery cells 116 and a negative terminal of battery cells 116 via power transistors 203 of power delivery circuit 120. Since there is no connection between the positive terminal of battery cells 116 and the negative terminal of battery cells 116 via power transistors 203, current cannot flow through the power delivery circuit 120. This means that power delivery circuit 120 may output zero volts to load 130 when operating according to the operation mode corresponding to configuration 200A.

As seen in FIG. 2B, configuration 200B includes power transistor(s) 223A-223D (collectively, "power transistors 223") and bypass transistor(s) 233A, 233B (collectively, "bypass transistors 233"). Power transistors 223 may be examples of power transistor(s) 222 of FIG. 1. Bypass transistor 233 may be examples of bypass transistors 132 of FIG. 1. In configuration 200B, power transistors 223A, 223D are turned on and power transistors 203C, 203D are turned off. Since power transistor 223A is turned on, current may flow from the positive terminal of battery cells 116 through the high side of power delivery circuit 120 via power transistor 223A. Since power transistor 223D is turned on, current may flow through the low side of power delivery circuit 120 to the negative terminal of battery cells 116 via power transistor 223D. Since according to configuration 200B, current flows from the positive terminal of battery cells 116 to the load 130 through the high side of power delivery circuit 120 and the current flows from load 130 through the low side of power delivery circuit 120 to the negative terminal of battery cells 116, power delivery circuit 120 may deliver a positive voltage to load 130 when operating in the operating mode corresponding to configuration 200B.

As seen in FIG. 2C, configuration 200C includes power transistor(s) 243A-243D (collectively, "power transistors 243") and bypass transistor(s) 253A, 253B (collectively, "bypass transistors 253"). Power transistors 243 may be examples of power transistor(s) 222 of FIG. 1. Bypass transistors 213 may be examples of bypass transistors 132 of FIG. 1. In configuration 200A, power transistors 243A, 243B are turned off and power transistors 253C, 253D are turned on. Since both of power transistors 203A, 203B are turned off, configuration 200C does not include any connection between a positive terminal of battery cells 116 and a negative terminal of battery cells 116 via power transistors 243 of power delivery circuit 120. Since there is no connection between the positive terminal of battery cells 116 and the negative terminal of battery cells 116 via power transistors 243, current cannot flow through the power delivery circuit 120. This means that power delivery circuit 120 may output zero volts to load 130 when operating according to the operation mode corresponding to configuration 200C.

As seen in FIG. 2D, configuration 200D includes power transistor(s) 263A-263D (collectively, "power transistors 263") and bypass transistor(s) 273A, 273B (collectively, "bypass transistors 273"). Power transistors 263 may be examples of power transistor(s) 222 of FIG. 1. Bypass transistors 273 may be examples of bypass transistors 132 of FIG. 1. In configuration 200D, power transistors 263A, 263D are turned off and power transistors 263C, 263D are turned on. Since power transistor 263B is turned on, current may flow from the positive terminal of battery cells 116 through the high side of power delivery circuit 120 via power transistor 263B. Since power transistor 263C is turned on, current may flow through the low side of power delivery circuit 120 to the negative terminal of battery cells 116 via power transistor 263C. Since according to configuration 200D, current flows from the positive terminal of battery cells 116 to the load 130 through the high side of power delivery circuit 120 and the current flows from load 130 through the low side of power delivery circuit 120 to the negative terminal of battery cells 116, power delivery circuit 120 may deliver a negative voltage to load 130 when operating in the operating mode corresponding to configuration 200D.

Figure 3:
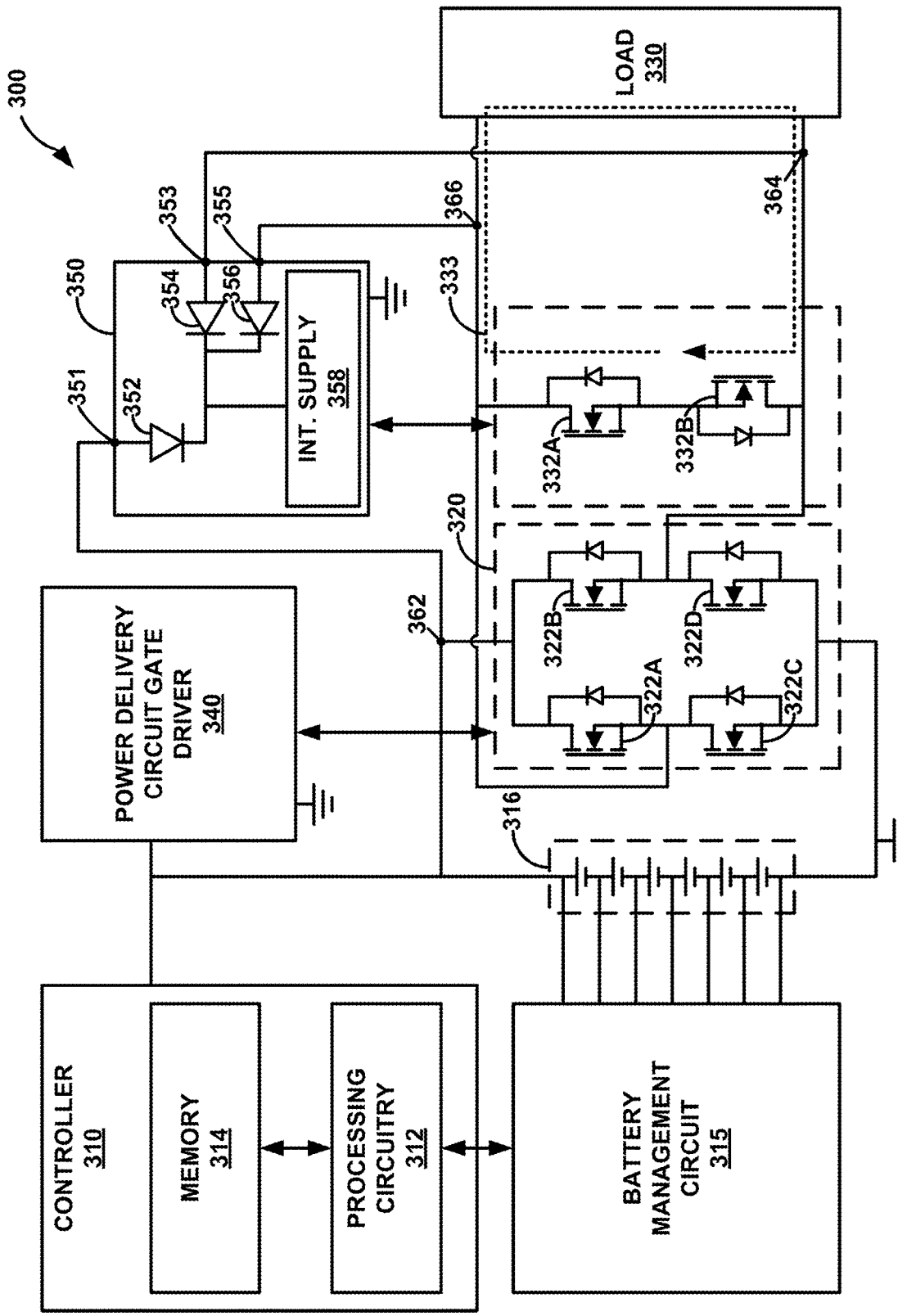
FIG. 3 is a circuit diagram illustrating a first example circuit for supplying power to a bypass driver circuit, in accordance with one or more techniques of this disclosure.

FIG. 3 is a circuit diagram illustrating a first example circuit 300 for supplying power to a bypass gate driver 350, in accordance with one or more techniques of this disclosure. As seen in FIG. 3, circuit 300 includes controller 310, power delivery circuit 320, bypass transistors 332A-332B (collectively, "bypass transistors 332"), load 330, power delivery circuit gate driver 340, and bypass gate driver 350. Controller 310 includes processing circuitry 312, memory 314, and battery management circuit 315. Power delivery circuit 320 includes power transistors 322A-322D (collectively, "power transistors 322"). Bypass gate driver 350 may include a primary supply input connection 351, a first diode 352, a first secondary supply input connection 353, a second diode 354, a second secondary supply input connection 355, a third diode 356, and internal supply unit 258.

Circuit 300 may be an example of system 100 of FIG. 1. Controller 310 may be an example of controller 110 of FIG. 1. Processing circuitry 312 may be an example of processing circuitry 112 of FIG. 1. Memory 314 may be an example of memory 114 of FIG. 1. Battery management circuit 315 may be an example of battery management circuit 115 of FIG. 1. Battery cells 316 may be examples of battery cells 116 of FIG. 1. Power delivery circuit 320 may be an example of power delivery circuit 120 of FIG. 1. Power transistors 322 may be examples of power transistor(s) 122 of FIG. 1. Bypass transistors 332 may be examples of bypass transistor(s) 132 of FIG. 2. Load 330 may be an example of load 130 of FIG. 1. Power delivery circuit gate driver 340 may be an example of power delivery circuit gate driver 140 of FIG. 1. Bypass gate driver 350 may be an example of bypass gate driver 150 of FIG. 1. Although six cells are illustrated, in some examples, battery cells 316 may comprise 12 battery cells, 16 battery cells, or any number. Battery management circuit 315 may be designed or configured to manage 12 or fewer cells or possibly 16 or fewer cells.

In some examples, bypass gate driver 350 may receive information indicating whether an error condition is present in power delivery circuit 320. In some examples, the information indicating whether an error condition is present in power delivery circuit 320 comprises a command, a message, or a command from controller 310. For example, controller 310 may identify the error condition present in power delivery circuit 320 and output a command for bypass gate driver 350 to control bypass transistors 332 to form the bypass current path 333. In some examples, bypass gate driver 350 may identify the error condition based on information received from power delivery circuit 320.

Bypass gate driver 350 may control, based on an error condition being present in power delivery circuit 320, bypass transistors 332 to define a bypass current path 333 between the bypass transistors 332 and the load 330. For example, bypass gate driver 350 may output a signal to a gate terminal of bypass transistor 332A that is sufficient for turning on bypass transistor 332A and bypass gate driver 350 may output a signal to a gate terminal of bypass transistor 332B that is sufficient for turning on bypass transistor 332B. In some examples, to turn on bypass transistor 332A and bypass transistor 332B, bypass gate driver 350 may output a voltage to the gate terminal of bypass transistor 332A that is greater than a threshold voltage and bypass gate driver 350 may output a voltage to the gate terminal of bypass transistor 332B that is greater than the threshold voltage. As seen in FIG. 3, a body diode of bypass transistor 332A faces a direction opposite a direction of the body diode of bypass transistor 332B. That is, bypass transistors 332 may be placed in an anti-series arrangement.

Bypass gate driver 350 includes a primary supply input connection 351 that is connected to first diode 352, a first secondary input supply connection 353 that is connected to second diode 354, and a second secondary supply input connection 355 that is connected to third diode 356. First diode 352, second diode 354, and third diode 356 may, in some examples, represent standalone diodes within bypass gate driver 350. In some examples, one or more of first diode 352, second diode 354, and third diode 356 may represent a body diode of a semiconductor device. For example, when a transistor such as a MOSFET operates as an active diode, the body diode of the MOSFET may act as a diode when the MOSFET is turned off, but the body diode of the MOSFET may be removed when the MOSFET is turned on. This means that whether the MOSFET is turned on or turned off controls whether the body diode of the MOSFET impacts operation of the circuit. Internal supply unit 358 may receive from one or more of first diode 352, second diode 354, and third diode 356, an electrical signal. Internal supply unit 358 may, in some examples, generate one or more output signals for sending to bypass transistors 332.

In the field of circuit electronics, diodes include semiconductor components which allow current to flow across the diode in a first direction (e.g., "forward direction") and prevent current from flowing across the diode in a second direction (e.g., "reverse direction"). A diode may include an anode and a cathode, and current may be able to pass through the diode in the forward direction from the anode to the cathode. However, current may be unable to pass through the diode in the reverse direction from the cathode to the anode.

In some examples, primary supply input connection 351 may supply bypass gate driver 350 with power from battery cells 316. For example, primary supply input connection 351 may be connected to node 362. Node 362 may be connected to a first side (e.g., a positive terminal) of battery cells 316. This means that primary supply input connection 351 may receive a signal having a voltage that is substantially the same as a voltage at node 362. When circuit 300 is operating normally and battery cells 316 supply power to load 330 via power delivery circuit 320, a voltage at node 362 may be equal to a voltage output from battery cells 316. When no error condition is present in battery cells 316 and or power delivery circuit 320, power received by bypass gate driver 350 via primary supply input connection 351 may exceed a power threshold for controlling bypass transistors 332 not to form the bypass current path 333.

First secondary supply input connection 353 and/or second secondary supply input connection 355 may supply bypass gate driver 350 with power from bypass current path 333. For example, when bypass gate driver 350 activates bypass transistors 332 to define bypass current path 333 based on an error condition being present in power delivery circuit 320, current may flow according to bypass current path 333. That is, current may flow clockwise from a first side of bypass transistors 332 to a first side of load 330, flow through load 330, flow from a second side of load 330 to a second side of bypass transistors 332, and flow through bypass transistors 332. Alternatively, current may flow counterclockwise from the second side of bypass transistors 332 to the second side of load 330, flow through load 330, flow from the second side of load 330 to the second side of bypass transistors 332, and flow through bypass transistors 332. In any case where bypass transistors 332 are activated and current flows according to bypass current path 333, first secondary supply input connection 353 and/or second secondary supply input connection 355 may supply power to bypass gate driver 350.

Bypass gate driver 350 may automatically receive power that is sufficient to control bypass transistors 332 to define bypass current path 333. For example, when an error condition present in power delivery circuit 320 causes an increase in a voltage at node 364 and/or node 366, bypass gate driver 350 may automatically receive power via first secondary supply input connection 353 and/or second secondary supply input connection 355 so that bypass gate driver 350 receives sufficient power for controlling bypass transistors 332 to define bypass current path 333. In other words, since first secondary supply input connection 353 and second secondary supply input connection 355 which connect bypass gate driver 350 to nodes along bypass current path 333, bypass gate driver 350 may automatically receive power from bypass current path 333 in the event of an error condition present in power delivery circuit 320 causing an increase in current and/or voltage at node 364 and/or node 366. In some examples, an increase in current and/or voltage at node 364 and/or node 366 may occur before gate driver circuit 350 receives a command to activate bypass transistors 332. This means that gate driver circuit 350 may automatically receive power via first secondary supply input connection 353 and/or second secondary supply input connection 355 so that bypass gate driver 350 receives sufficient power to turn on bypass transistors 332 when bypass gate driver 350 receives a command to turn on bypass transistors 332.

As seen in FIG. 3, power transistors 322 of power delivery circuit 320 may form an H-bridge circuit. An error condition present in power delivery circuit 320 may include an error condition present in one or more of power transistors 322. For example, an error condition may be present in any one or combination of power transistor 322A, power transistor 322B, power transistor 322C, and power transistor 322D. Error conditions present in power transistors 322 may include a power transistor failure that prevents current from flowing across the power transistor. For example, a power transistor failure at power transistor 322A may prevent current from flowing across power transistor 322A, a power transistor failure at power transistor 322B may prevent current from flowing across power transistor 322B, and so on. Other error conditions include shorts across power transistors, partial failures that attenuate an amount of current that can flow across a power transistor, other kinds of error conditions, or any combination thereof. In some examples, an error condition present in one or more of power transistors 322 may prevent the H-bridge circuit formed by power transistors 322 from operating according to one or more operating modes.

In some examples, when an error condition is present at power transistor 322A and bypass gate driver 350 activates bypass transistors 332, current may flow counterclockwise according to bypass current path 333. In some examples, when an error condition is present at power transistor 322B and bypass gate driver 350 activates bypass transistors 332, current may flow clockwise according to bypass current path 333. When bypass gate driver 350 activates bypass transistors 332 based on an error condition being present at power transistor 322B, bypass gate driver 350 may receive power from first secondary supply input connection 353 connected to node 364. When bypass gate driver 350 activates bypass transistors 332 based on an error condition being present at power transistor 322A, bypass gate driver 350 may receive power from second secondary supply input connection 355 connected to node 366. In some examples, bypass gate driver 350 may receive power from first secondary supply input connection 353 and/or second secondary supply input connection 355 when an error condition is present at one or more locations other than power transistor 322A and power transistor 322B.

Power received via first secondary supply input connection 353 and/or second secondary supply input connection 355 may exceed a power threshold for controlling bypass transistors 332 to define the bypass current path 333. As used herein, the term "power threshold" may refer to a current threshold and/or a voltage threshold. That is, when bypass gate driver 350 receives a voltage exceeding a voltage threshold and/or a current greater than a current threshold, bypass gate driver 350 may be configured to control bypass transistors 332 to define the bypass current path 333. When bypass gate driver 350 receives a voltage that does not exceed a voltage threshold and/or a current that does not exceed a current threshold, bypass gate driver 350 might not receive power that is sufficient to control bypass transistors 332 to define the bypass current path 333.

In some examples, when an error condition is present in power delivery circuit 320, bypass gate driver 350 may receive, via primary supply input connection 351, power from battery cells 316. But when the error condition is present in power delivery circuit 320, the power received by bypass gate driver 350 via primary supply input connection 351 might not exceed the power threshold for controlling bypass transistors 332 to define the bypass current path 333. In some examples, power received from first secondary supply input connection 353 and/or second secondary supply input connection 355 may supplement power received from primary supply input connection 351 so that the total power received by bypass gate driver 350 exceeds the power threshold for controlling the bypass transistors 332 to define the bypass current path 333.

Figure 4:
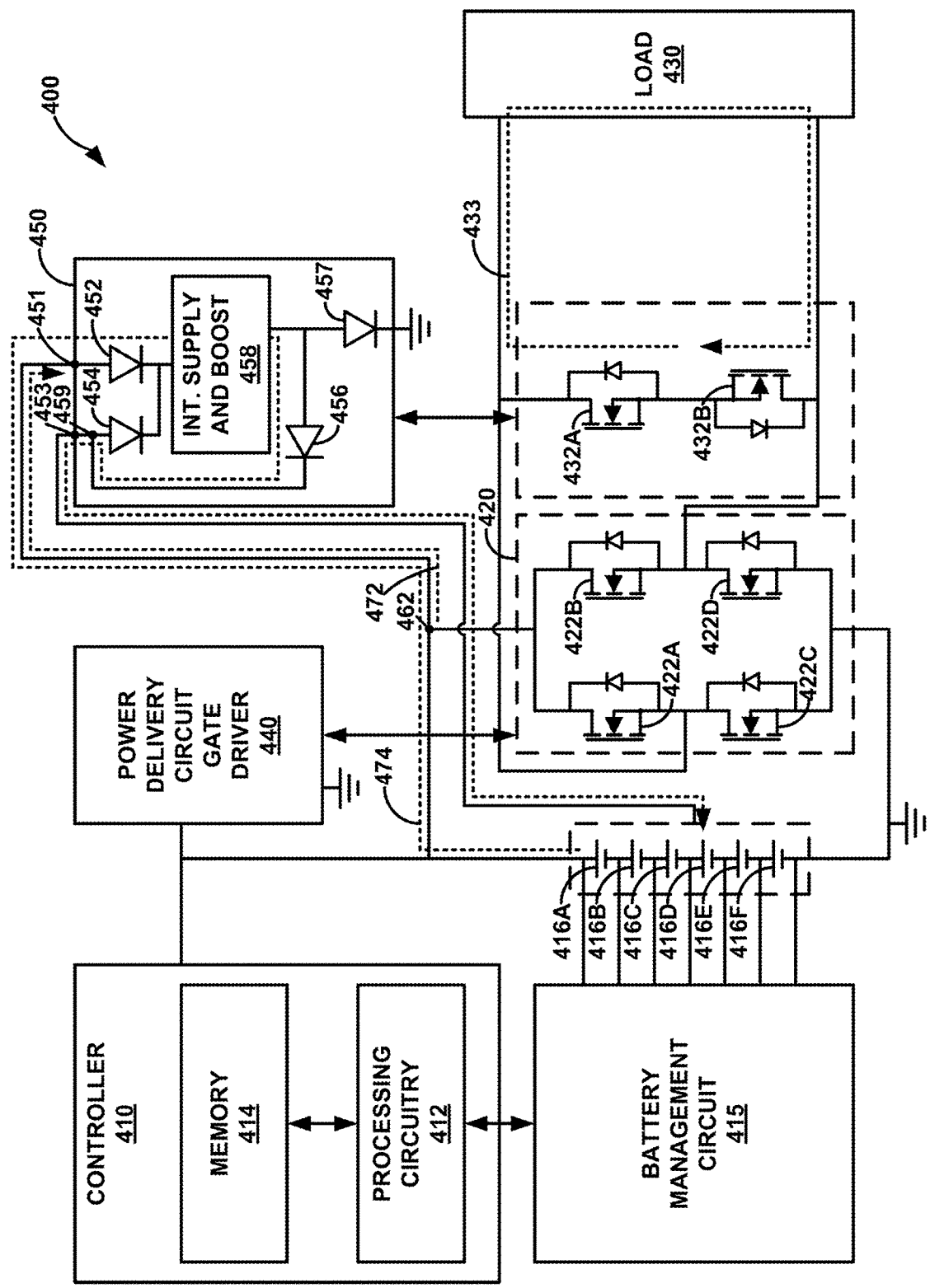
FIG. 4 is a circuit diagram illustrating a second example circuit for supplying power to a bypass driver circuit, in accordance with one or more techniques of this disclosure.

FIG. 4 is a circuit diagram illustrating a second example circuit 400 for supplying power to a bypass driver circuit 450, in accordance with one or more techniques of this disclosure. As seen in FIG. 4, circuit 400 includes controller 410, battery cells 416A-416F (collectively, "battery cells 416"), power delivery circuit 420, bypass transistors 432A-432B (collectively, "bypass transistors 432"), load 430, power delivery circuit gate driver 440, and bypass gate driver 450. Controller 410 includes processing circuitry 412, memory 414, and battery management circuit 415. Power delivery circuit 420 includes power transistors 422A-422D (collectively, "power transistors 422"). Bypass gate driver 450 may include a first supply connection 451, a first diode 452, a second supply connection 453, a second diode 454, a third diode 456, a fourth diode 457, and an internal supply and boost unit 458. Although six cells are illustrated, in some examples, battery cells 416 may comprise 12 battery cells, 16 battery cells, or any number. Battery management circuit 415 may be designed or configured to manage 12 or fewer cells or possibly 16 or fewer cells.

Circuit 400 may be an example of system 100 of FIG. 1. Controller 410 may be an example of controller 410 of FIG. 1. Processing circuitry 412 may be an example of processing circuitry 112 of FIG. 1. Memory 414 may be an example of memory 114 of FIG. 1. Battery management circuit 415 may be an example of battery management circuit 115 of FIG. 1. Battery cells 416 may be examples of battery cells 116 of FIG. 1. Power delivery circuit 420 may be an example of power delivery circuit 120 of FIG. 1. Power transistors 422 may be examples of power transistor(s) 122 of FIG. 1. Bypass transistors 432 may be examples of bypass transistor(s) 132 of FIG. 2. Load 430 may be an example of load 130 of FIG. 1. Power delivery circuit gate driver 440 may be an example of power delivery circuit gate driver 140 of FIG. 1. Bypass gate driver 450 may be an example of bypass gate driver 150 of FIG. 1.

In some examples, bypass gate driver 450 may receive information indicating whether an error condition is present in battery cells 416. In some examples, the information indicating whether an error condition is present in battery cells 416 comprises a command, a message, or a command from controller 410. For example, controller 410 may identify the error condition present in battery cells 416 and output a command for bypass gate driver 450 to control bypass transistors 432 to form the bypass current path 433. In some examples, bypass gate driver 450 may identify the error condition based on information received from battery cells 416.

Bypass gate driver 450 may control, based on an error condition being present in battery cells 416, bypass transistors 432 to define a bypass current path 433 between the bypass transistors 432 and the load 430. For example, bypass gate driver 450 may output a signal to a gate terminal of bypass transistor 432A that is sufficient for turning on bypass transistor 432A and bypass gate driver 450 may output a signal to a gate terminal of bypass transistor 432B that is sufficient for turning on bypass transistor 432B. In some examples, to turn on bypass transistor 432A and bypass transistor 432B, bypass gate driver 450 may output a voltage to the gate terminal of bypass transistor 432A that is greater than a threshold voltage and bypass gate driver 450 may output a voltage to the gate terminal of bypass transistor 432B that is greater than the threshold voltage. As seen in FIG. 4, a body diode of bypass transistor 432A faces a direction opposite a direction of the body diode of bypass transistor 432B. That is, bypass transistors 432 may be placed in an anti-series arrangement.

In some examples, battery cells 416A-416F may be connected in series so that an output voltage from battery cells 416A-416F is a sum of the voltage output from each of battery cells 416A-416F. When circuit 400 is operating normally with no error conditions present in battery cells 416, current may flow across each of battery cells 416A-416F and battery cells 416 may supply power to load 430 via power delivery circuit 420. But when one or more error conditions are present in battery cells 416, this may prevent current from flowing across each of battery cells 416A-416F from a first side of battery cells 416 to a second side of battery cells 416. Battery cells 416 are not limited to including six cells. In some examples, Battery cells 416 may include more than six cells or fewer than six cells.

When no error conditions are present in battery cells 416, bypass gate driver 450 may receive power via a primary driver circuit supply path 472. As seen in FIG. 4, first supply connection 451 is connected to node 462. Node 462 is connected to a side of battery cells 416. In some examples, node 462 is connected to the side of battery cells 416 corresponding to the positive terminal of battery cells 416. Primary driver circuit supply path 472 deliver power to bypass gate driver 450 by delivering power from node 462 to first supply connection 451. In some examples, according to primary driver circuit supply path 472, current may flow from node 462 to first supply connection 451, flow from first supply connection 451 through first diode 452, flow through internal supply and boost unit 458, and flow through fourth diode 457 to ground. In some examples, bypass gate driver 450 might not include fourth diode 457. In these examples, current may flow from internal supply and boost unit 458 to ground without flowing through fourth diode 457.

When no error conditions are present in battery cells 416, current may flow from a positive terminal of battery cells 416 through node 462, and flow from node 462 to power delivery circuit 420. At least some of the current that flows through node 462 from battery cells 416 may flow to bypass gate driver 450, and at least some of the current that flows through node 462 from battery cells 416 may flow to power delivery circuit 420. When no error conditions are present in battery cells 416, power received by bypass gate driver 450 via primary driver circuit supply path 472 may exceed a power threshold for controlling bypass transistors 432 not to form the bypass current path.

When an error condition is present in battery cells 416, this may prevent current from flowing across each of battery cells 416A-416F. Error conditions present in battery cells 416 may include one or more broken connections between consecutive cells of battery cells 416A-416F, one or more broken connections within a cell of battery cells 416A-416F, one or more short connections, or any combination thereof. An error condition is present in battery cells 416 may, in some examples, prevent or current from flowing across each of battery cells 416A-416F and prevent battery cells 416 from supplying power to load 430 via power delivery circuit 420 according to a circuit across each of battery cells 416A-416F. For example, when an error condition prevents current from flowing across each of battery cells 416A-416F, this may break a circuit connecting the positive terminal of battery cells 416 and the negative terminal of battery cells 416.

Bypass gate driver 450 may be configured to receive power via secondary driver circuit supply path 474 in response to one or more error conditions being present in battery cells 416. Secondary driver circuit supply path 474 may allow current to traverse one or more of battery cells 416A-416F even when an error connection prevents current from traversing all of battery cells 416A-416F. For example, when an error condition at battery cell 416E prevents current from flowing across battery cells 416A-416F from battery cell 416F to battery cell 416A, current may still be able to flow from battery cell 416D to battery cell 416A without reaching the error condition at battery cell 416E. Secondary driver circuit supply path 474 may create a circuit that allows bypass gate driver 450 to receive power from battery cells 416 even when an error condition breaks a circuit across battery cells 416.

For example, secondary driver circuit supply path 474 may extend across one or more cells of battery cells 416A-416F from a node within cells of battery cells 416A-416F to a positive terminal of battery cells 416 (e.g., the positive terminal at the end of battery cell 416A). The node within cells of battery cells 416A-416F may be located between consecutive nodes of battery cells 416A-416F. In some examples, the node within cells of battery cells 416A-416F may be located between battery cell 416A and battery cell 416B. In some examples, the node within cells of battery cells 416A-416F may be located between battery cell 416B and battery cell 416C. In some examples, the node within cells of battery cells 416A-416F may be located between battery cell 416C and battery cell 416D. In some examples, the node within cells of battery cells 416A-416F may be located between battery cell 416D and battery cell 416E. In some examples, the node within cells of battery cells 416A-416F may be located between battery cell 416E and battery cell 416F. In any case, secondary driver circuit supply path 474 may extend across one or more cells of battery cells 416A-416F without extending across one or more other cells of battery cells 416A-416F.

When bypass gate driver 450 receives power according to secondary driver circuit supply path 474, current may flow from a positive terminal of battery cells 416 to node 462, flow from node 462 to first supply connection 451, flow from first supply connection 451 through first diode 452, flow from first diode 452 through internal supply and boost unit 458, flow from internal supply and boost unit 458 through third diode 456, flow from third diode 456 to node 459, flow from node 459 to second supply connection 453, and flow from second supply connection 453 to a node within battery cells 416. In some examples when no error connection is present between the node within battery cells 416 and the positive terminal of battery cells 416 (e.g., the positive terminal of battery cell 416A), one or more cells of battery cells 416A-416F located between the node within battery cells 416 and the positive terminal of battery cells 416 may supply power to bypass gate driver 450 via secondary driver circuit supply path 474 even when one or more error conditions are present between the node within battery cells 416 and the negative terminal of battery cells 416 (e.g., a negative terminal of battery cell 416F).

Bypass gate driver 450 may automatically receive power that is sufficient to control bypass transistors 432 to define bypass current path 433. For example, in response to an error condition present in battery cells 416 causing a short that prevents current from flowing across battery cells 416, bypass gate driver 450 may automatically receive power via secondary driver circuit supply path 474 so that bypass gate driver 450 receives sufficient power for controlling bypass transistors 432 to define bypass current path 433. In other words, since secondary driver circuit supply path 474 may cross one or more battery cells of battery cells 416 without crossing the error condition, bypass gate driver 450 may automatically receive power via secondary driver circuit supply path 474 in the event of an error condition present in battery cells 416 that prevents bypass gate driver 450 from receiving power via primary driver circuit supply path 472. In some examples, an error condition in battery cells 416 may occur before gate driver circuit 450 receives a command to activate bypass transistors 432. This means that gate driver circuit 450 may automatically receive power via secondary driver circuit supply path 474 so that bypass gate driver 450 receives sufficient power to turn on bypass transistors 432 when bypass gate driver 450 receives a command to turn on bypass transistors 432.

First diode 452, second diode 454, third diode 456, and fourth diode 457 may, in some examples, represent stand-alone diodes within bypass gate driver 450. In some examples, one or more of first diode 452, second diode 454, third diode 456, and fourth diode 457 may represent a body diode of a semiconductor device. For example, when a transistor such as a MOSFET operates as an active diode, the body diode of the MOSFET may act as a diode when the MOSFET is turned off, but the body diode of the MOSFET may be removed when the MOSFET is turned on. This means that whether the MOSFET is turned on or turned off controls whether the body diode of the MOSFET impacts operation of the circuit.

For example, when the node within battery cells 416 of secondary driver circuit supply path 474 is located between battery cell 416A and battery cell 416B, battery cell 416A may supply power to bypass gate driver 450 via secondary driver circuit supply path 474 even when an error condition is present between the node and the negative terminal of battery cell 416F. When the node within battery cells 416 of secondary driver circuit supply path 474 is located between battery cell 416B and battery cell 416C, battery cells 416A and 416B may supply power to bypass gate driver 450 via secondary driver circuit supply path 474 even when an error condition is present between the node and the negative terminal of battery cell 416F. When the node within battery cells 416 of secondary driver circuit supply path 474 is located between battery cell 416C and battery cell 416D, battery cells 416A-416C may supply power to bypass gate driver 450 via secondary driver circuit supply path 474 even when an error condition is present between the node and the negative terminal of battery cell 416F. When the node within battery cells 416 of secondary driver circuit supply path 474 is located between battery cell 416D and battery cell 416E, battery cells 416A-416D may supply power to bypass gate driver 450 via secondary driver circuit supply path 474 even when an error condition is present between the node and the negative terminal of battery cell 416F. When the node within battery cells 416 of secondary driver circuit supply path 474 is located between battery cell 416E and battery cell 416F, battery cells 416A-416E may supply power to bypass gate driver 450 via secondary driver circuit supply path 474 even when an error condition is present between the node and the negative terminal of battery cell 416F.

Bypass gate driver 450 may receive, based on an error condition being present in battery cells 416, power from secondary driver circuit supply path 474. In some examples, the power received by bypass gate driver 450 from secondary driver circuit supply path 474 may exceed a power threshold for controlling bypass transistors 432 to define the bypass current path 433. Current may flow through the secondary driver circuit supply path 474 without reaching the error condition present in battery cells 416. That is, current may flow through one or more of battery cells 416A-416F according to secondary driver circuit supply path 474 without reaching an error condition that is present in battery cells 416A-416F.

Figure 5:
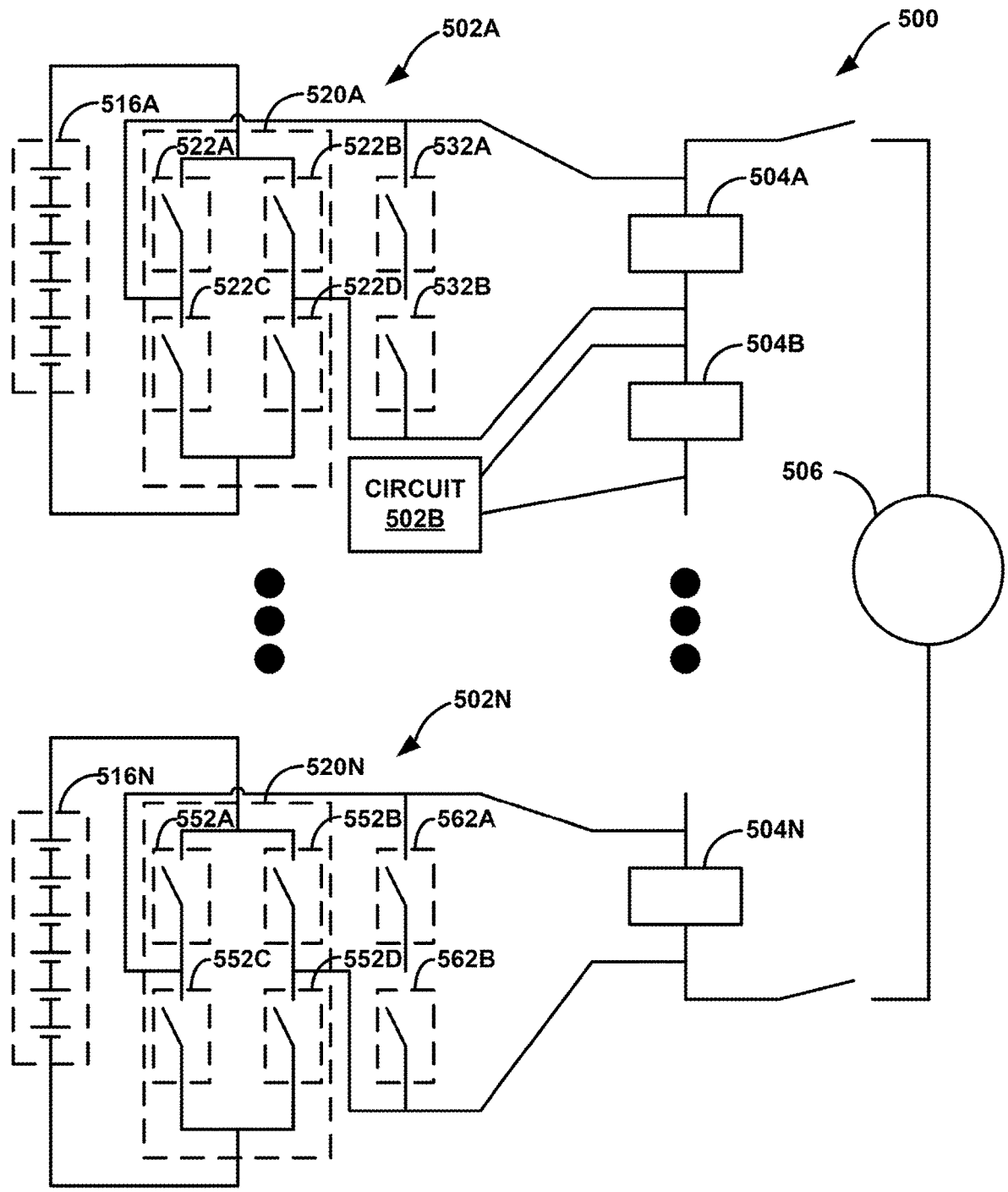
FIG. 5 is a circuit diagram illustrating a system including a set of circuits each configured to supply power to a power unit of a set of power units that supply power to a common load.

FIG. 5 is a circuit diagram illustrating a system 500 including a set of circuits 502A-502N (collectively, "circuits 502") each configured to supply power to a power unit of a set of power units 504A-504N that supply power to a common load 506. Each circuit of circuits 502 may include battery cells, a power delivery circuit, and bypass transistors. For example, circuit 502A includes battery cells 516A, power delivery circuit 520A including power transistors 522A-522D, and bypass transistors 532A, 532B. Circuit 502B includes battery cells (not illustrated in FIG. 5), a power delivery circuit (not illustrated in FIG. 5) including power transistors (not illustrated in FIG. 5), and bypass transistors (not illustrated in FIG. 5). Circuit 502N includes battery cells 516N, power delivery circuit 520N including power transistors 552A-552D, and bypass transistors 562A, 562B. Circuits 502 may, in some examples, include one or more components not illustrated in FIG. 5 such as controllers and gate drivers.

In some examples, each circuit of circuits 502 may be an example of system 100 of FIG. 1, circuit 300 of FIG. 3, or circuit 400 of FIG. 4. Each set of battery cells of battery cells 516A-516N may be an example of battery cells 116 of FIG. 1, battery cells 316 of FIG. 3, or battery cells 416 of FIG. 4. Each power delivery circuit of power delivery circuits 520A-520N may be an example of power delivery circuit 120 of FIG. 1, power delivery circuit 320 of FIG. 3 or power delivery circuit 420 of FIG. 4. Each power unit of power units 504A-504N may be an example of load 130 of FIG. 1, load 330 of FIG. 3, or load 430 of FIG. 4.

The power delivery circuit of each circuit of circuits 502 may be configured to supply a positive voltage, a negative voltage, or zero voltage to the respective power unit of power units 504. For example, power delivery circuit 520A may be configured to supply a positive voltage, a negative voltage, or zero voltage to power unit 504A, the power delivery circuit of circuit 504B may be configured to supply a positive voltage, a negative voltage, or zero voltage to power unit 504B, and so on. In some examples, when a power delivery circuit delivers a positive or a negative voltage, the voltage has a constant magnitude. For example, power delivery circuit 520A may deliver positive 24 Volts (+24V), negative 24 Volts (−24V), or zero Volts (0V). The magnitude of power output from power delivery circuits is not limited to 24V. The constant magnitude may include any number of Volts.

In some examples, circuits 502 may control a voltage delivered to each of power units 504A-504N in order to control a voltage delivered to common load 506. In some examples, the voltage delivered to common load 506 may represent a summation of the voltage delivered to each of power units 504A-504N. For example, when power delivery circuit 520A delivers 24V to power unit 504A and power delivery circuit 520B delivers 24V to power unit 504B but each other power delivery circuit delivers 0V to the respective power unit, power units 504 may deliver 48V to common load 506.

Figure 6:
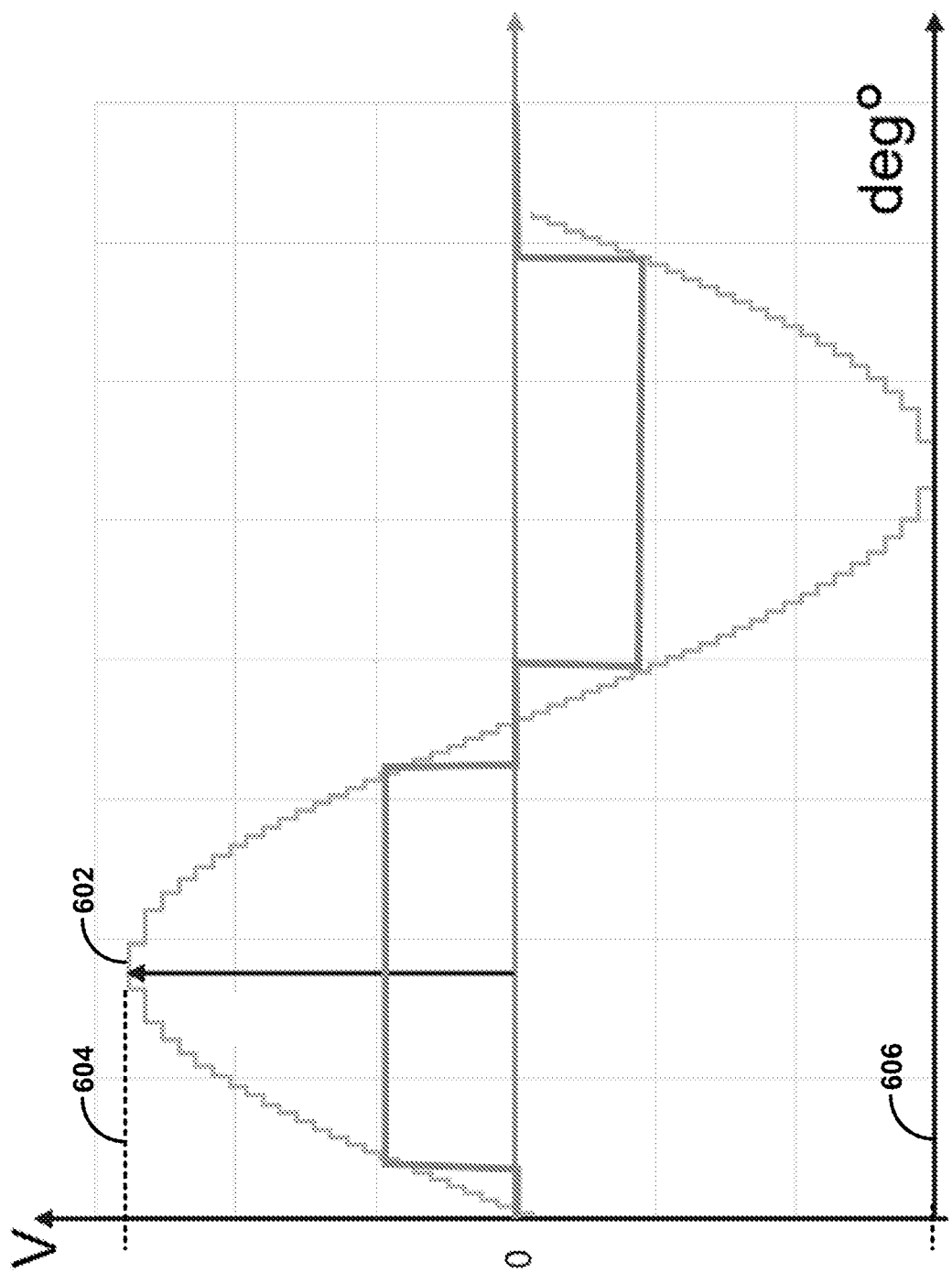
FIG. 6 is a plot diagram illustrating a plot of a voltage output from a set of power units to common load, in accordance with one or more techniques of this disclosure.

FIG. 6 is a plot diagram illustrating a plot 602 of a voltage output from a set of power units to common load, in accordance with one or more techniques of this disclosure. In some examples, plot 602 may indicate the voltage output from the set of power units 504 to the common load 506.

As seen in FIG. 6, plot 602 indicates that the voltage output from power units 504 to the common load 506 oscillates between a positive maximum voltage 604 and a negative minimum voltage 606. In some examples, the set of power units 504 may output the positive maximum voltage 604 when each power unit of power units 504 receives a positive voltage. In some examples, the set of power units 504 may output the negative minimum voltage 606 when each power unit of power units 504 receives a negative voltage. Circuits 502 may control power delivery circuits 520 to output positive voltage, negative voltage, or zero voltage in order to cause the voltage output from the set of power units 504 to the common load 506 to oscillate according to plot 602.

Figure 7:
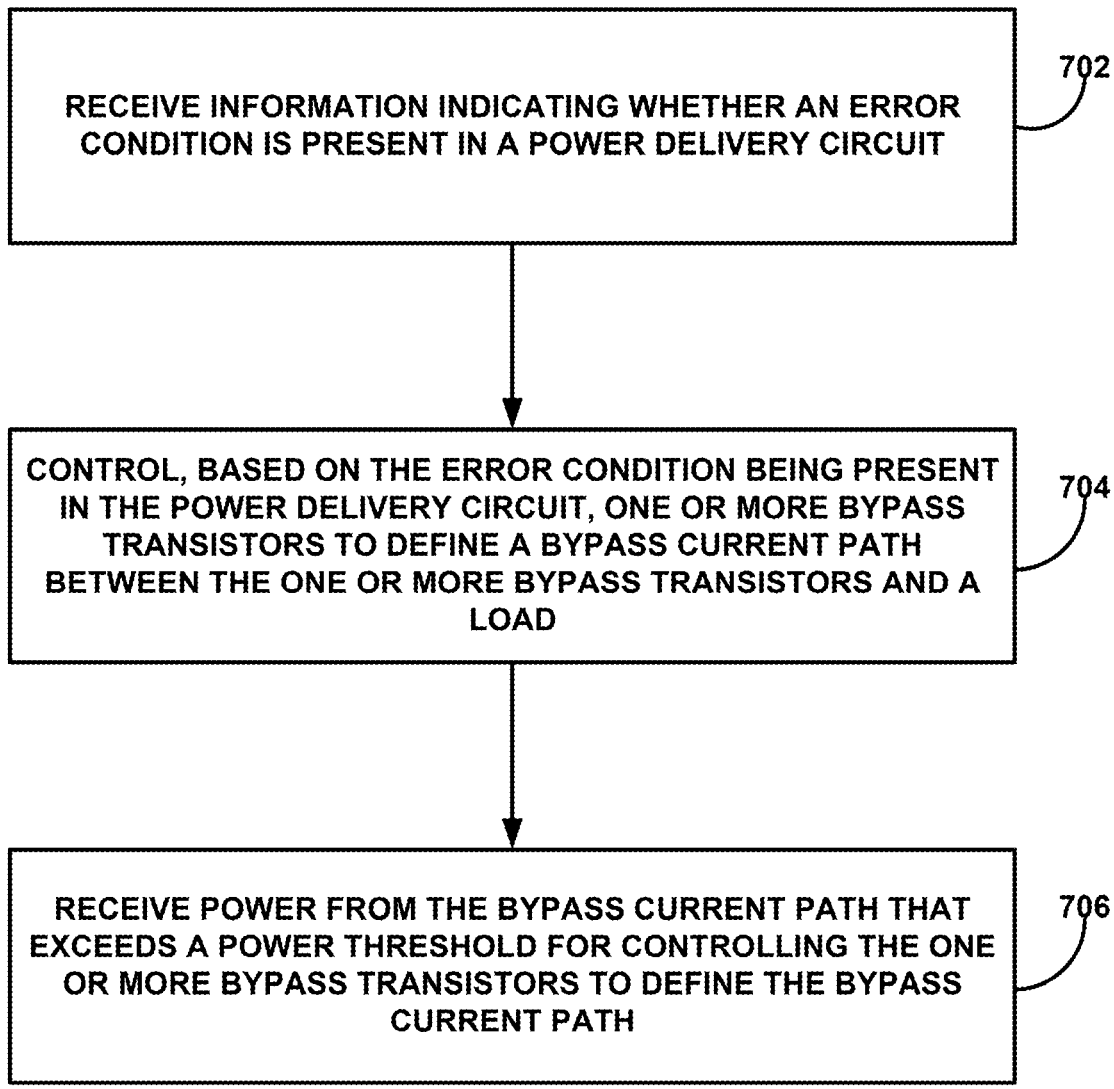
FIG. 7 is a flow diagram illustrating an example operation for supplying power to a bypass gate driver when an error condition is present in a power delivery circuit, in accordance with one or more techniques of this disclosure.

FIG. 7 is a flow diagram illustrating an example operation for supplying power to a bypass gate driver when an error condition is present in a power delivery circuit, in accordance with one or more techniques of this disclosure. FIG. 7 is described with respect to circuit 300 of FIG. 3. However, the techniques of FIG. 7 may be performed by different components of circuit 300 or by additional or alternative systems.

Bypass gate driver 350 may receive information indicating whether an error condition is present in power delivery circuit 320 (702). In some examples, the information indicating whether an error condition is present comprises a command from controller 310 to control bypass transistors 332 to define bypass current path 333. In some examples, bypass gate driver 350 is configured to identify the error condition based on information received from power delivery circuit 320. In some examples, controller 310 may identify the error condition present in power delivery circuit 320 based on information received from power delivery circuit 320 and output a command to bypass gate driver 350 to define the bypass current path 333.

Bypass gate driver 350 may control, based on the error condition being present in power delivery circuit 320, bypass transistors 332 to define a bypass current path 333 between bypass transistors 332 and load 330 (704). In some examples, when bypass gate driver 350 controls bypass transistors 332 to define the bypass current path 333, current may flow according to bypass current path 333 without reaching power delivery circuit 320. In some examples, when bypass gate driver 350 receives power that exceeds a power threshold for controlling bypass transistors 332 to define the bypass current path 333, bypass gate driver 350 may be configured to control bypass transistors 332 to define the bypass current path 333. In some examples, when bypass gate driver 350 receives power that does not exceed a power threshold for controlling bypass transistors 332 to define the bypass current path 333, bypass gate driver 350 might not be configured to control bypass transistors 332 to define the bypass current path 333.

Bypass gate driver 350 may receive power from bypass current path 333 that exceeds a power threshold for controlling the bypass transistors 332 to define the bypass current path 333 (706). By receiving power from bypass current path 333, bypass gate driver 350 may receive power that exceeds the power threshold for controlling bypass transistors 332 to define the bypass current path 333. For example, bypass gate driver 350 may be configured to receive power from battery cells 316 via primary supply input connection 351, receive power from bypass current path 333 via first secondary supply input connection 353, receive power from bypass current path 333 via second secondary supply input connection 355, or any combination thereof.

In some examples, when an error condition is present in power delivery circuit 320, power received by bypass gate driver 350 might not exceed the power threshold for controlling the bypass transistors 332 to define the bypass current path 333. But when an error condition is present in power delivery circuit 320 and bypass gate driver 350 controls bypass transistors 332 to define the bypass current path 333, bypass gate driver 350 may receive power via first secondary supply input connection 353 and/or second secondary supply input connection 355 such that power received by bypass gate driver 350 exceeds the power threshold for controlling bypass transistors 332 to define the bypass current path 333.

Figure 8:
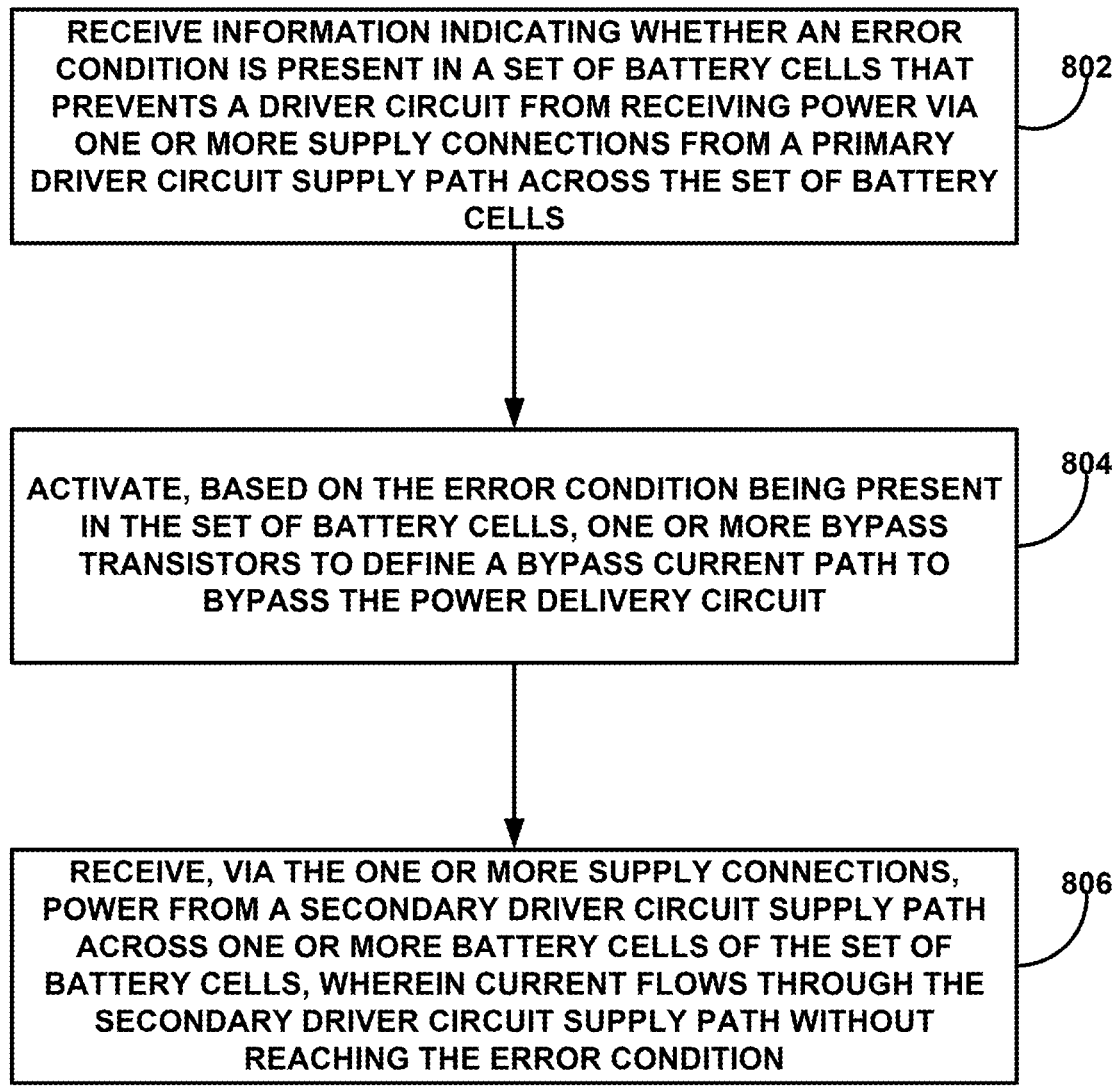
FIG. 8 is a flow diagram illustrating an example operation for supplying power to a bypass gate driver when an error condition is present in a set of battery cells, in accordance with one or more techniques of this disclosure.

FIG. 8 is a flow diagram illustrating an example operation for supplying power to a bypass gate driver when an error condition is present in a set of battery cells, in accordance with one or more techniques of this disclosure. FIG. 8 is described with respect to circuit 400 of FIG. 4. However, the techniques of FIG. 8 may be performed by different components of circuit 400 or by additional or alternative systems.

Bypass gate driver 450 may receive information indicating whether an error condition is present in battery cells 416 that prevents bypass gate driver circuit 450 from receiving power via one or more supply connections from a primary driver circuit supply path 472 across battery cells 416 (802). For example, when an error condition is present in battery cells 416, this may prevent current from flowing across battery cells 416. Bypass gate driver 450 may activate, based on the error condition being present in battery cells 416, bypass transistors 432 to define bypass current path 433 to bypass the power delivery circuit 420 (804). Bypass gate driver 450 may receive, via the one or more supply connections, power from secondary driver circuit supply path 474 across battery cells 416, where current flows through the secondary driver circuit supply path 474 without reaching the error condition (806).

The following numbered clauses may demonstrate one or more aspects of the disclosure.

Clause 1: A driver circuit is configured control one or more bypass transistors, the driver circuit comprising: a primary supply input connection configured to supply the driver circuit with power from a set of battery cells, wherein the set of battery cells is configured to supply power to a load via a power delivery circuit; and one or more secondary supply input connections. The driver circuit is configured to: receive information indicating whether an error condition is present in the power delivery circuit; control, based on the error condition being present in the power delivery circuit, the one or more bypass transistors to define a bypass current path between the one or more bypass transistors and the load; and receive, via a secondary supply input connection of the one or more secondary supply input connections, power from the bypass current path, wherein the power from the bypass current path exceeds a power threshold for controlling the one or more bypass transistors to define the bypass current path.

Clause 2: The driver circuit of clause 1, wherein the driver circuit is further configured to receive, via the primary supply input connection, the power from the set of battery cells when the error condition is present in the power delivery circuit, and wherein the power from the set of battery cells does not exceed the power threshold for controlling the one or more bypass transistors to define the bypass current path.

Clause 3: The driver circuit of any of clauses 1-2, wherein the power threshold is a first power threshold, and wherein the driver circuit is further configured to: control, based on the error condition not being present in the power delivery circuit, the one or more bypass transistors to not define the bypass current path; and receive, via the primary supply input connection, power from the set of battery cells that exceeds a second power threshold for controlling the one or more bypass transistors not to define the bypass current path.

Clause 4: The driver circuit of any of clauses 1-3, wherein the one or more secondary supply input connections comprises: a first secondary supply input connection configured to supply the driver circuit with power from a first node of the bypass current path when the error condition is present at a first node of the power delivery circuit; and a second secondary supply input connection configured to supply the driver circuit with power from a second node of the bypass current path when the error condition is present at a second node of the power delivery circuit.

Clause 5: The driver circuit of clause 4, wherein the power delivery circuit comprises two or more power transistors, wherein the first node of the power delivery circuit comprises a first power transistor of the two or more power transistors, and wherein the second node of the power delivery circuit comprises a second power transistor of the two or more power transistors.

Clause 6: The driver circuit of any of clauses 1-5, wherein the power delivery circuit comprises an H-bridge circuit including a first power transistor, a second power transistor, a third power transistor, and a fourth power transistor, and wherein the error condition comprises a failure of one or more of the first power transistor, the second power transistor, the third power transistor, and the fourth power transistor.

Clause 7: The driver circuit of clause 6, wherein the H-bridge circuit is configured to: supply, according to a first operating mode, zero voltage to the load when the first power transistor and the second power transistor are turned on and the third power transistor and the fourth power transistor are turned off; supply, according to a second operating mode, a positive voltage to the load when the first power transistor and the fourth power transistor are turned on and the second power transistor and the third power transistor are turned off; supply, according to a third operating mode, zero voltage to the load when the first power transistor and the second power transistor are turned off and the third power transistor and the fourth power transistor are turned on; and supply, according to a fourth operating mode, a negative voltage to the load when the first power transistor and the fourth power transistor are turned off and the second power transistor and the third power transistor are turned on, wherein the error condition comprising the failure of one or more of the first power transistor, the second power transistor, the third power transistor, and the fourth power transistor prevents the H-bridge circuit from operating according to one or more of the first operating mode, the second operating mode, the third operating mode, and the fourth operating mode.

Clause 8: The driver circuit of any of clauses 1-7, wherein the one or more bypass transistors comprise a first bypass transistor and a second bypass transistor placed in an anti-series arrangement so that a body diode of the first bypass transistor and a body diode of the second bypass transistor face opposite directions.

Clause 9: The driver circuit of any of clauses 1-8, wherein to control the one or more bypass transistors to define the bypass current path, the driver circuit is configured to: apply a voltage to a gate terminal of each bypass transistor of the one or more bypass transistors that is sufficient to turn on the one or more bypass transistors so that current flows across the one or more bypass transistors, wherein the voltage sufficient to turn on the one or more bypass transistors corresponds to the power threshold for controlling the one or more bypass transistors to define the bypass current path.

Clause 10: The driver circuit of any of clauses 1-9, wherein the error condition present in the power delivery circuit causes a current avalanche, and wherein the current avalanche causes the driver circuit to receive power from the bypass current path that exceeds the power threshold for controlling the one or more bypass transistors to define the bypass current path.

Clause 11: The driver circuit of any of clauses 1-9, wherein the load comprises an electrical motor of a vehicle.

Clause 12: The driver circuit of clause 11, wherein the power delivery circuit comprises an H-bridge circuit configured as a stepwise inverter circuit for controlling the electrical motor of the vehicle.

Clause 13: A method for controlling one or more bypass transistors, the method comprising: supplying, by a primary supply input connection of a driver circuit, the driver circuit with power from a set of battery cells, wherein the set of battery cells is configured to supply power to a load via a power delivery circuit; receiving, by the driver circuit, information indicating whether an error condition is present in the power delivery circuit; controlling, by the driver circuit based on the error condition being present in the power delivery circuit, the one or more bypass transistors to define a bypass current path for bypassing the power delivery circuit; and receiving, by the driver circuit via a secondary supply input connection of the one or more secondary supply input connections, power from the bypass current path, wherein the power from the bypass current path exceeds a power threshold for controlling the one or more bypass transistors to define the bypass current path.

Clause 14: The method of clause 13, further comprising: receiving, by the driver circuit via the primary supply input connection, the power from the set of battery cells when the error condition is present in the power delivery circuit, wherein the power from the set of battery cells does not exceed the power threshold for controlling the one or more bypass transistors to define the bypass current path.

Clause 15: The method of any of clauses 13-14, wherein the power threshold is a first power threshold, and wherein the method further comprises: controlling, by the driver circuit based on the error condition not being present in the power delivery circuit, the one or more bypass transistors to not define the bypass current path; and receiving, by the driver circuit via the primary supply input connection, power from the set of battery cells that exceeds a second power threshold for controlling the one or more bypass transistors not to define the bypass current path.

Clause 16: The method of any of clauses 13-15, further comprising: supplying, by a first secondary supply input connection of the one or more secondary supply input connections, the driver circuit with power from a first node of the bypass current path when the error condition is present at a first node of the power delivery circuit; supplying, by a second secondary supply input connection, the driver circuit with power from a second node of the bypass current path when the error condition is present at a second node of the power delivery circuit.

Clause 17: The method of clause 16, wherein the power delivery circuit comprises two or more power transistors, wherein the first node of the power delivery circuit comprises a first power transistor of the two or more power transistors, and wherein the second node of the power delivery circuit comprises a second power transistor of the two or more power transistors.

Clause 18: The method of any of clauses 13-17, wherein the power delivery circuit comprises an H-bridge circuit including a first power transistor, a second power transistor, a third power transistor, and a fourth power transistor, wherein the error condition comprises a failure of one or more of the first power transistor, the second power transistor, the third power transistor, and the fourth power transistor.

Clause 19: The method of clause 18, wherein controlling the one or more bypass transistors to define the bypass current path comprises: applying, by the driver circuit, a voltage to a gate terminal of each bypass transistor of the one or more bypass transistors that is sufficient to turn on the one or more bypass transistors so that current flows across the one or more bypass transistors, wherein the voltage sufficient to turn on the one or more bypass transistors corresponds to the power threshold for controlling the one or more bypass transistors to define the bypass current path.

Clause 20: A system comprising: a set of battery cells; a power delivery circuit that includes four power transistors arranged in an H-bridge, wherein the power delivery circuit is configured to deliver power from the set of battery cells to a load; an H-bridge driver circuit configured to control the four power transistors arranged in the H-bridge; one or more bypass transistors; and a bypass driver circuit configured control the one or more bypass transistors. The bypass driver circuit includes a primary supply input connection configured to supply the bypass driver circuit with power from the set of battery cells; and one or more secondary supply input connections. The bypass driver circuit is configured to: receive information indicating whether an error condition is present in the power delivery circuit; control, based on the error condition being present in the power delivery circuit, the one or more bypass transistors to define the bypass current path for bypassing power delivery circuit; and receive, via a secondary supply input connection of the one or more secondary supply input connections, power from the bypass current path, wherein the power from the bypass current path exceeds a power threshold for controlling the one or more bypass transistors to define the bypass current path.

Clause 21: The system of clause 20, wherein the system further comprises the load, and wherein the four power transistors arranged in the H-bridge are configured as a stepwise inverter circuit for controlling an electrical motor of a vehicle.

Clause 22: A driver circuit configured control one or more bypass transistors, the driver circuit comprising: one or more supply connections configured to supply power from a set of battery cells, wherein the set of battery cells is configured to supply power to a load via a power delivery circuit. The driver circuit is configured to: receive information indicating whether an error condition is present in the set of battery cells that prevents the driver circuit from receiving power via the one or more supply connections from a primary driver circuit supply path across the set of battery cells; activate, based on the error condition being present in the set of battery cells, the one or more bypass transistors to define a bypass current path to bypass the power delivery circuit; and receive, via the one or more supply connections, power from a secondary driver circuit supply path across one or more battery cells of the set of battery cells, wherein current flows through the secondary driver circuit supply path without reaching the error condition.

Clause 23: The driver circuit of clause 22, wherein the one or more supply connections comprise: a first supply connection that is connected to a first node located on a side of the set of battery cells; and a second supply connection that is connected to a second node located within the set of battery cells, wherein the one or more battery cells of the set of battery cells include each battery cell of the set of battery cells between the first node and the second node, and wherein the driver circuit is configured to receive power from the secondary driver circuit supply path via the first supply connection and the second supply connection.

Clause 24: The driver circuit of clause 23, wherein the driver circuit is configured to receive the power from the secondary driver circuit supply path when current flows from the second node to the first node through the one or more battery cells, flows from the first node to the first supply connection, flows through the driver circuit from the first supply connection to the second supply connection, and flows to the second node from the second supply connection.

Clause 25: The driver circuit of any of clauses 23-24, wherein the driver circuit further comprises: a first diode, wherein an anode of the first diode is connected to the first supply connection; a second diode, wherein an anode of the second diode connected to the second supply connection; an internal supply unit connected to a cathode of the first diode and a cathode of the second diode; and a third diode, wherein an anode of the third diode is connected to the internal supply unit and a cathode of the third diode is connected to a third node between the second supply connection and the second diode.

Clause 26: The driver circuit of clause 25, wherein the driver circuit is configured to receive power from the secondary driver circuit supply path when current flows from the first supply connection to the first diode, flows from the internal supply unit to the third diode, and flows from the third diode to the second supply connection.

Clause 27: The driver circuit of any of clauses 22-26, wherein the one or more supply connections comprise: a supply connection that is connected to a node located on a first side of the set of battery cells, wherein the primary driver circuit supply path crosses the set of battery cells between the first side of the set of battery cells and a second side of the set of battery cells, wherein the driver circuit is further configured to: deactivate, based on the error condition not being present in the one or more battery cells, the one or more bypass transistors; and receive, via the supply connection, the power from the primary driver circuit supply path.

Clause 28: The driver circuit of clause 27, wherein the driver circuit is configured to receive the power from the primary driver circuit supply path when current flows from the second side to the first side across the set of battery cells, flows from the first side to the power delivery circuit across the node, flows from the power delivery circuit to the load, flows from the load to the power delivery circuit, and flows from the power delivery circuit to the second side of the set of battery cells.

Clause 29: The driver circuit of any of clauses 22-28, wherein the one or more bypass transistors comprise a first bypass transistor and a second bypass transistor placed in an anti-series arrangement so that a body diode of the first bypass transistor and a body diode of the second bypass transistor face opposite directions.

Clause 30: The driver circuit of any of clauses 22-29, wherein to activate the one or more bypass transistors to define the bypass current path, the driver circuit is configured to: apply a voltage to a gate terminal of each bypass transistor of the one or more bypass transistors that is sufficient to activate the one or more bypass transistors so that current flows across the one or more bypass transistors, wherein the power received from the secondary driver circuit supply path exceeds a power threshold for activating the one or more bypass transistors.

Clause 31: The driver circuit of any of clauses 22-30, wherein the load comprises one or more electrical systems of a vehicle.

Clause 32: A method comprising: receiving, by a driver circuit comprising one or more supply connections configured to supply power from a set of battery cells, information indicating whether an error condition is present in a set of battery cells that prevents the driver circuit from receiving power from a primary driver circuit supply path across the set of battery cells, wherein the set of battery cells is configured to supply power to a load via a power delivery circuit; activating, by the driver circuit based on the error condition being present in the set of battery cells, the one or more bypass transistors to define a bypass current path to bypass the power delivery circuit; and receiving, by the driver circuit via the one or more supply connections, power from a secondary driver circuit supply path across one or more battery cells of the set of battery cells, wherein current flows through the secondary driver circuit supply path without reaching the error condition.

Clause 33: The method of clause 32, wherein the one or more supply connections comprise: a first supply connection that is connected to a first node located on a side of the set of battery cells; and a second supply connection that is connected to a second node located within the set of battery cells, wherein the one or more battery cells of the set of battery cells include each battery cell of the set of battery cells between the first node and the second node, and wherein the method comprises receiving, by the driver circuit, power from the secondary driver circuit supply path via the first supply connection and the second supply connection.

Clause 34: The method of clause 33, wherein the method comprises receiving the power from the secondary driver circuit supply path when current flows from the second node to the first node through the one or more battery cells, flows from the first node to the first supply connection, flows through the driver circuit from the first supply connection to the second supply connection, and flows to the second node from the second supply connection.

Clause 35: The method of any of clauses 33-34, wherein the driver circuit further comprises: a first diode, wherein an anode of the first diode is connected to the first supply connection; a second diode, wherein an anode of the second diode connected to the second supply connection; an internal supply unit connected to a cathode of the first diode and a cathode of the second diode; and a third diode, wherein an anode of the third diode is connected to the internal supply unit and a cathode of the third diode is connected to a third node between the second supply connection and the second diode.

Clause 36: The method of clause 35, wherein the method further comprises receiving, by the driver circuit, power from the secondary driver circuit supply path when current flows from the first supply connection to the first diode, flows from the internal supply unit to the third diode, and flows from the third diode to the second supply connection.

Clause 37: The method of any of clauses 32-36, wherein the one or more supply connections comprise a supply connection that is connected to a node located on a first side of the set of battery cells, wherein the primary driver circuit supply path crosses the set of battery cells between the first side of the set of battery cells and a second side of the set of battery cells, and wherein the method further comprises: deactivating, by the driver circuit based on the error condition not being present in the one or more battery cells, the one or more bypass transistors; and receiving, by the driver circuit via the supply connection, the power from the primary driver circuit supply path.

Clause 38: The method of clause 37, wherein the method further comprises receiving, by the driver circuit, the power from the primary driver circuit supply path when current flows from the second side to the first side across the set of battery cells, flows from the first side to the power delivery circuit across the node, flows from the power delivery circuit to the load, flows from the load to the power delivery circuit, and flows from the power delivery circuit to the second side of the set of battery cells.

Clause 39: The method of any of clauses 32-38, wherein activating the one or more bypass transistors to define the bypass current path comprises: applying, by the driver circuit, a voltage to a gate terminal of each bypass transistor of the one or more bypass transistors that is sufficient to activate the one or more bypass transistors so that current flows across the one or more bypass transistors, wherein the power received from the secondary driver circuit supply path exceeds a power threshold for activating the one or more bypass transistors.

Clause 40: The method of any of clauses 32-39, wherein the load comprises an electrical motor of a vehicle.

Clause 41: A system comprising: a set of battery cells; a power delivery circuit that includes four power transistors arranged in an H-bridge, wherein the power delivery circuit is configured to deliver power from the set of battery cells to a load; an H-bridge driver circuit configured to control the four power transistors arranged in the H-bridge; one or more bypass transistors; and a bypass driver circuit configured control the one or more bypass transistors, the bypass driver circuit comprising one or more supply connections configured to supply power from the set of battery cells. The bypass driver circuit is configured to: receive information indicating whether an error condition is present in the set of battery cells that prevents the bypass driver circuit from receiving power via the one or more supply connections from a primary driver circuit supply path across the set of battery cells; activate, based on the error condition being present in the set of battery cells, the one or more bypass transistors to define a bypass current path to bypass the power delivery circuit; and receive, via the one or more supply connections, power from a secondary driver circuit supply path across one or more battery cells of the set of battery cells, wherein current flows through the secondary driver circuit supply path without reaching the error condition.

The techniques described in this disclosure may be implemented, at least in part, in hardware, software, firmware or any combination thereof. For example, various aspects of the described techniques may be implemented within one or more processors, including one or more microprocessors, DSPs, ASICs, FPGAs, or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include RAM, ROM, programmable read only memory (PROM), erasable programmable read only memory (EPROM), EEPROM, flash memory, a hard disk, a compact disc read-only memory (CD-ROM), a floppy disk, a cassette, magnetic media, optical media, or other computer readable media.

Various examples have been described. These and other examples are within the scope of the following claims.

What is claimed is:

1. A driver circuit configured to control one or more bypass power transistors, the driver circuit comprising:
a primary supply input connection configured to supply the driver circuit with power from a set of battery cells, wherein the set of battery cells is configured to supply power to a load via a power delivery circuit; and
one or more secondary supply input connections,
wherein the driver circuit is configured to:
receive information indicating whether an error condition is present in the power delivery circuit;
control, based on the error condition being present in the power delivery circuit, the one or more bypass power transistors to define a bypass current path between the one or more bypass power transistors and the load; and receive, via a secondary supply input connection of the one or more secondary supply input connections, power from the bypass current path, wherein the power from the bypass current path exceeds a power threshold for controlling the one or more bypass power transistors to define the bypass current path.

2. The driver circuit of claim 1,
wherein the driver circuit is further configured to receive, via the primary supply input connection, the power from the set of battery cells when the error condition is present in the power delivery circuit, and
wherein the power from the set of battery cells does not exceed the power threshold for controlling the one or more bypass power transistors to define the bypass current path.

3. The driver circuit of claim 1, wherein the power threshold is a first power threshold, and wherein the driver circuit is further configured to:
control, based on the error condition not being present in the power delivery circuit, the one or more bypass power transistors to not define the bypass current path; and
receive, via the primary supply input connection, power from the set of battery cells that exceeds a second power threshold for controlling the one or more bypass power transistors not to define the bypass current path.

4. The driver circuit of claim 1, wherein the one or more secondary supply input connections comprises:
a first secondary supply input connection configured to supply the driver circuit with power from a first node of the bypass current path when the error condition is present at a first node of the power delivery circuit; and
a second secondary supply input connection configured to supply the driver circuit with power from a second node of the bypass current path when the error condition is present at a second node of the power delivery circuit.

5. The driver circuit of claim 4, wherein the power delivery circuit comprises two or more power transistors, wherein the first node of the power delivery circuit comprises a first power transistor of the two or more power transistors, and wherein the second node of the power delivery circuit comprises a second power transistor of the two or more power transistors.

6. The driver circuit of claim 1, wherein the power delivery circuit comprises an H-bridge circuit including a first power transistor, a second power transistor, a third power transistor, and a fourth power transistor, and
wherein the error condition comprises a failure of one or more of the first power transistor, the second power transistor, the third power transistor, and the fourth power transistor.

7. The driver circuit of claim 6, wherein the H-bridge circuit is configured to:
supply, according to a first operating mode, zero voltage to the load when the first power transistor and the second power transistor are turned on and the third power transistor and the fourth power transistor are turned off;
supply, according to a second operating mode, a positive voltage to the load when the first power transistor and the fourth power transistor are turned on and the second power transistor and the third power transistor are turned off;
supply, according to a third operating mode, zero voltage to the load when the first power transistor and the second power transistor are turned off and the third power transistor and the fourth power transistor are turned on; and
supply, according to a fourth operating mode, a negative voltage to the load when the first power transistor and the fourth power transistor are turned off and the second power transistor and the third power transistor are turned on,
wherein the error condition comprising the failure of one or more of the first power transistor, the second power transistor, the third power transistor, and the fourth power transistor prevents the H-bridge circuit from operating according to one or more of the first operating mode, the second operating mode, the third operating mode, and the fourth operating mode.

8. The driver circuit of claim 1, wherein the one or more bypass power transistors comprise a first bypass power transistor and a second bypass power transistor placed in an anti-series arrangement so that a body diode of the first bypass power transistor faces a first direction and a body diode of the second bypass power transistor faces a second direction opposite the first direction.

9. The driver circuit of claim 1, wherein to control the one or more bypass power transistors to define the bypass current path, the driver circuit is configured to:
apply a voltage to a gate terminal of each bypass power transistor of the one or more bypass power transistors that is sufficient to turn on the one or more bypass power transistors so that current flows across the one or more bypass power transistors,
wherein the voltage sufficient to turn on the one or more bypass power transistors corresponds to the power threshold for controlling the one or more bypass power transistors to define the bypass current path.

10. The driver circuit of claim 1,
wherein the error condition present in the power delivery circuit causes a current avalanche, and
wherein the current avalanche causes the driver circuit to receive power from the bypass current path that exceeds the power threshold for controlling the one or more bypass power transistors to define the bypass current path.

11. The driver circuit of claim 1, wherein the load comprises an electrical motor of a vehicle.

12. The driver circuit of claim 11, wherein the power delivery circuit comprises an H-bridge circuit configured as a step-wise inverter circuit for controlling the electrical motor of the vehicle.

13. A method for controlling one or more bypass power transistors, the method comprising:
supplying, by a primary supply input connection of a driver circuit, the driver circuit with power from a set of battery cells, wherein the set of battery cells is configured to supply power to a load via a power delivery circuit;
receiving, by the driver circuit, information indicating whether an error condition is present in the power delivery circuit;
controlling, by the driver circuit based on the error condition being present in the power delivery circuit, the one or more bypass power transistors to define a bypass current path for bypassing the power delivery circuit; and
receiving, by the driver circuit via a secondary supply input connection of the one or more secondary supply input connections, power from the bypass current path, wherein the power from the bypass current path exceeds a power threshold for controlling the one or more bypass power transistors to define the bypass current path.

14. The method of claim 13, further comprising:
receiving, by the driver circuit via the primary supply input connection, the power from the set of battery cells when the error condition is present in the power delivery circuit,
wherein the power from the set of battery cells does not exceed the power threshold for controlling the one or more bypass power transistors to define the bypass current path.

15. The method of claim 13, wherein the power threshold is a first power threshold, and wherein the method further comprises:
controlling, by the driver circuit based on the error condition not being present in the power delivery circuit, the one or more bypass power transistors to not define the bypass current path; and
receiving, by the driver circuit via the primary supply input connection, power from the set of battery cells that exceeds a second power threshold for controlling the one or more bypass power transistors not to define the bypass current path.

16. The method of claim 13, further comprising:
supplying, by a first secondary supply input connection of the one or more secondary supply input connections, the driver circuit with power from a first node of the bypass current path when the error condition is present at a first node of the power delivery circuit;
supplying, by a second secondary supply input connection, the driver circuit with power from a second node of the bypass current path when the error condition is present at a second node of the power delivery circuit.

17. The method of claim 16, wherein the power delivery circuit comprises two or more power transistors, wherein the first node of the power delivery circuit comprises a first power transistor of the two or more power transistors, and wherein the second node of the power delivery circuit comprises a second power transistor of the two or more power transistors.

18. The method of claim 13, wherein the power delivery circuit comprises an H-bridge circuit including a first power transistor, a second power transistor, a third power transistor, and a fourth power transistor,
wherein the error condition comprises a failure of one or more of the first power transistor, the second power transistor, the third power transistor, and the fourth power transistor.

19. The method of claim 18, wherein controlling the one or more bypass power transistors to define the bypass current path comprises:
applying, by the driver circuit, a voltage to a gate terminal of each bypass power transistor of the one or more bypass power transistors that is sufficient to turn on the one or more bypass power transistors so that current flows across the one or more bypass power transistors,
wherein the voltage sufficient to turn on the one or more bypass power transistors corresponds to the power threshold for controlling the one or more bypass power transistors to define the bypass current path.

20. A system comprising:
a set of battery cells;
a power delivery circuit that includes four power transistors arranged in an H-bridge, wherein the power delivery circuit is configured to deliver power from the set of battery cells to a load;
an H-bridge driver circuit configured to control the four power transistors arranged in the H-bridge;
one or more bypass power transistors; and
a bypass driver circuit configured control the one or more bypass power transistors, the bypass driver circuit comprising:
a primary supply input connection configured to supply the bypass driver circuit with power from the set of battery cells; and
one or more secondary supply input connections,
wherein the bypass driver circuit is configured to:
receive information indicating whether an error condition is present in the power delivery circuit;
control, based on the error condition being present in the power delivery circuit, the one or more bypass power transistors to define a bypass current path for bypassing power delivery circuit; and
receive, via a secondary supply input connection of the one or more secondary supply input connections, power from the bypass current path, wherein the power from the bypass current path exceeds a power threshold for controlling the one or more bypass power transistors to define the bypass current path.

21. The system of claim 20,
wherein the system further comprises the load, and
wherein the four power transistors arranged in the H-bridge are configured as a step-wise inverter circuit for controlling an electrical motor of a vehicle.

* * * * *